(12) United States Patent
Yu et al.

(10) Patent No.: US 12,641,871 B2
(45) Date of Patent: May 26, 2026

(54) FIN-TYPE FIELD EFFECT TRANSISTOR WITH INDEPENDENTLY BIASABLE SUPPLEMENTARY GATE AND METHOD

(71) Applicant: GlobalFoundries U.S. Inc., Malta, NY (US)

(72) Inventors: Hong Yu, Clifton Park, NY (US); Navneet K. Jain, Milpitas, CA (US); David Charles Pritchard, Schenectady, NY (US); Romain H. A. Feuillette, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 343 days.

(21) Appl. No.: 18/354,114

(22) Filed: Jul. 18, 2023

(65) Prior Publication Data

US 2025/0031439 A1    Jan. 23, 2025

(51) Int. Cl.
*H10D 84/83*       (2025.01)
*H10D 64/01*       (2025.01)
(Continued)

(52) U.S. Cl.
CPC ..... *H10D 84/834* (2025.01); *H10D 64/01326* (2026.01); *H10D 84/013* (2025.01); (Continued)

(58) Field of Classification Search
CPC ............. H10D 84/834; H10D 84/0158; H10D 84/0153; H10D 84/0151; H10D 84/038; (Continued)

(56) References Cited

U.S. PATENT DOCUMENTS 7,859,044 B2    12/2010 Wong et al.
10,199,378 B2    2/2019 Jain et al.
(Continued)

FOREIGN PATENT DOCUMENTS

EP        3324436 B1    8/2020

OTHER PUBLICATIONS

Liu, "Imec Demonstrates Excellent Performance of Si FinFET CMOS devices with Integrated Tungsten Buried Power Rails," Press Release, 2020 Symposia on VLSI Technology and Circuits, IMEC, Jun. 15, 2020, 18 pages.
(Continued)

*Primary Examiner* — Sonya McCall-Shepard
(74) *Attorney, Agent, or Firm* — Francois Pagette; Hoffman Warnick LLC

(57) ABSTRACT

A disclosed structure includes a semiconductor fin on a substrate and an isolation region on the substrate laterally surrounding a lower portion of the fin. A fin-type field effect transistor (FINFET) includes an upper portion of the fin and an isolation structure, and a gate structure are on the isolation region and positioned laterally adjacent to the upper portion of the fin. The gate structure also extends over the top of the fin and abuts the isolation structure. The FINFET also includes an independently biasable supplementary gate structure integrated into the isolation structure. Specifically, an opening extends into the isolation structure adjacent to, but separated from, the fin. The supplementary gate structure includes a conductor layer within the opening and that portion of the isolation structure between the conductor layer and the semiconductor fin. Also disclosed are associated methods.

20 Claims, 23 Drawing Sheets

100.2

(51) Int. Cl.

| | | |
|---|---|---|
| *H10D 84/01* | (2026.01) | |
| *H10D 84/03* | (2025.01) | |
| *H10W 20/00* | (2026.01) | |

(52) U.S. Cl.

CPC ..... *H10D 84/0151* (2025.01); *H10D 84/0158* (2025.01); *H10D 84/038* (2025.01)

(58) Field of Classification Search

CPC ............. H10D 84/0149; H10D 84/013; H10D 64/01326; H01L 21/76898; H01L 23/5286; H01L 23/485; H01L 21/76895; H01L 21/743; H01L 23/481; H01L 23/535; H10W 20/023

See application file for complete search history.

(56) References Cited

U.S. PATENT DOCUMENTS

| | | | |
|---|---|---|---|
| 10,423,078 B1 | 9/2019 | Shen et al. | |
| 10,615,265 B2 | 4/2020 | Ghani et al. | |
| 2014/0203376 A1 | 7/2014 | Xie et al. | |
| 2018/0061976 A1* | 3/2018 | Zang .................... | H10D 30/721 |
| 2018/0261514 A1* | 9/2018 | Xie ...................... | H10D 84/038 |
| 2019/0067115 A1 | 2/2019 | Park et al. | |
| 2020/0135580 A1 | 4/2020 | Hsieh et al. | |
| 2021/0082766 A1 | 3/2021 | Miura et al. | |
| 2024/0136254 A1* | 4/2024 | Kang ................... | H10D 62/121 |

OTHER PUBLICATIONS

Fenouillet-Beranger, "Advanced Planar FDSOI devices," Leti Innovation for Industry, Jul. 16, 2014, 63 pages.

Fronheiser et al., "Impact of Aggressive Fin Width Scaling on FinFET Device Characteristics," IEEE 2017, 4 pages.

Raaijmakers, "ASML reduces DUV overlay error to 1 nanometer," Bits&Chips, Apr. 7, 2021, 13 pages.

Huang et al., "Integration Challenges of TSV Backside via Reveal Process," IEEE Electronic Components & Technology Conference, 2013, downloaded on Jun. 1, 2023 from IEEE Xplore, pp. 915-917.

Jourdain et al., "Buried Power Rails and Nano-Scale TSV: Technology Boosters for Backside Power Delivery Network and 3D Heterogeneous Integration," IEEE 72nd Electronic Components and Technology Conference (ECTC), 2022, pp. 1531-1538.

Wen, "The Other Side of the Wafer: The Latest Developments in Backside Power Delivery," retrieved from: https://www.coventor.com/blog/latest-developments-backside-power-delivery/ on Jun. 1, 2023, Published on Dec. 19, 2022, 4 pages.

U.S. Appl. No. 18/301,382, filed Apr. 17, 2023, 54 pages.

U.S. Appl. No. 18/301,382, Office Action dated Apr. 14, 2026, 13 pages.

* cited by examiner

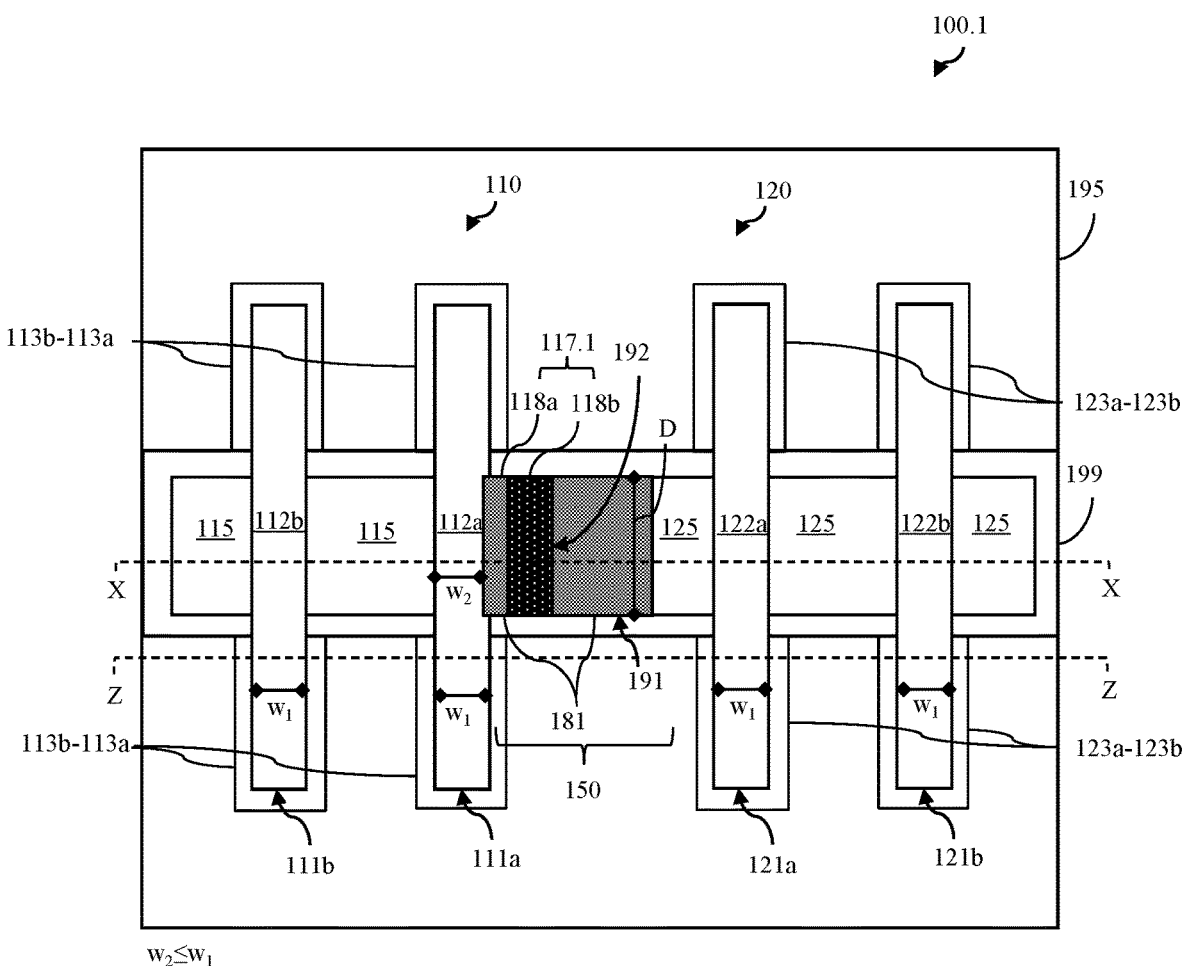
FIG. 1.1A

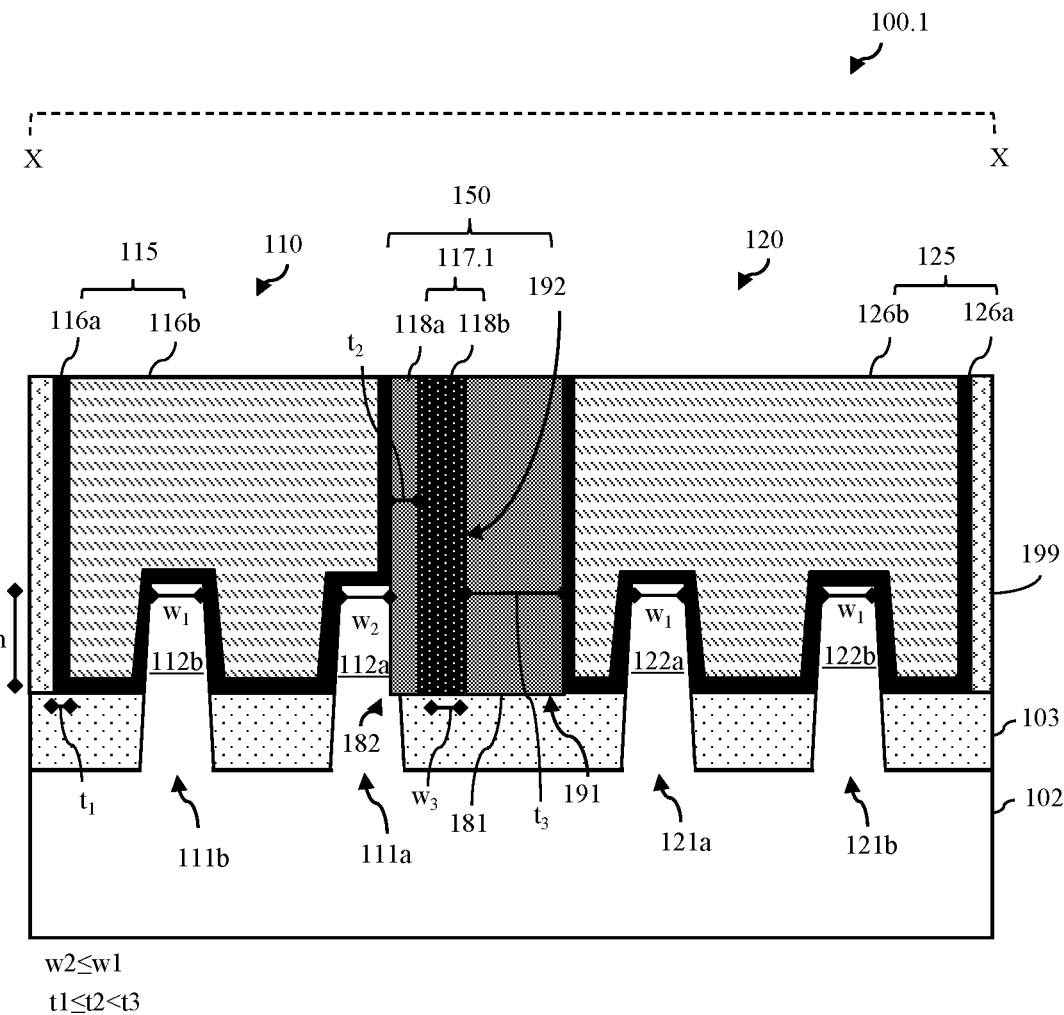
FIG. 1.1B

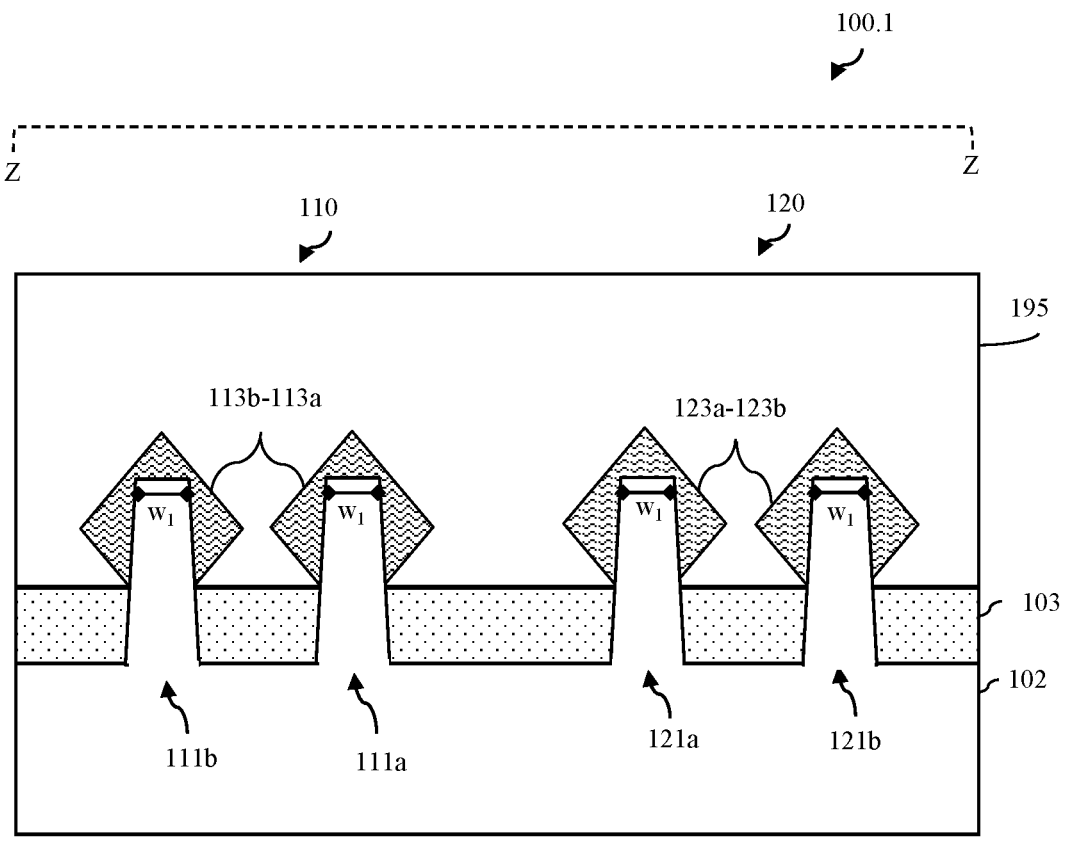
FIG. 1.1C

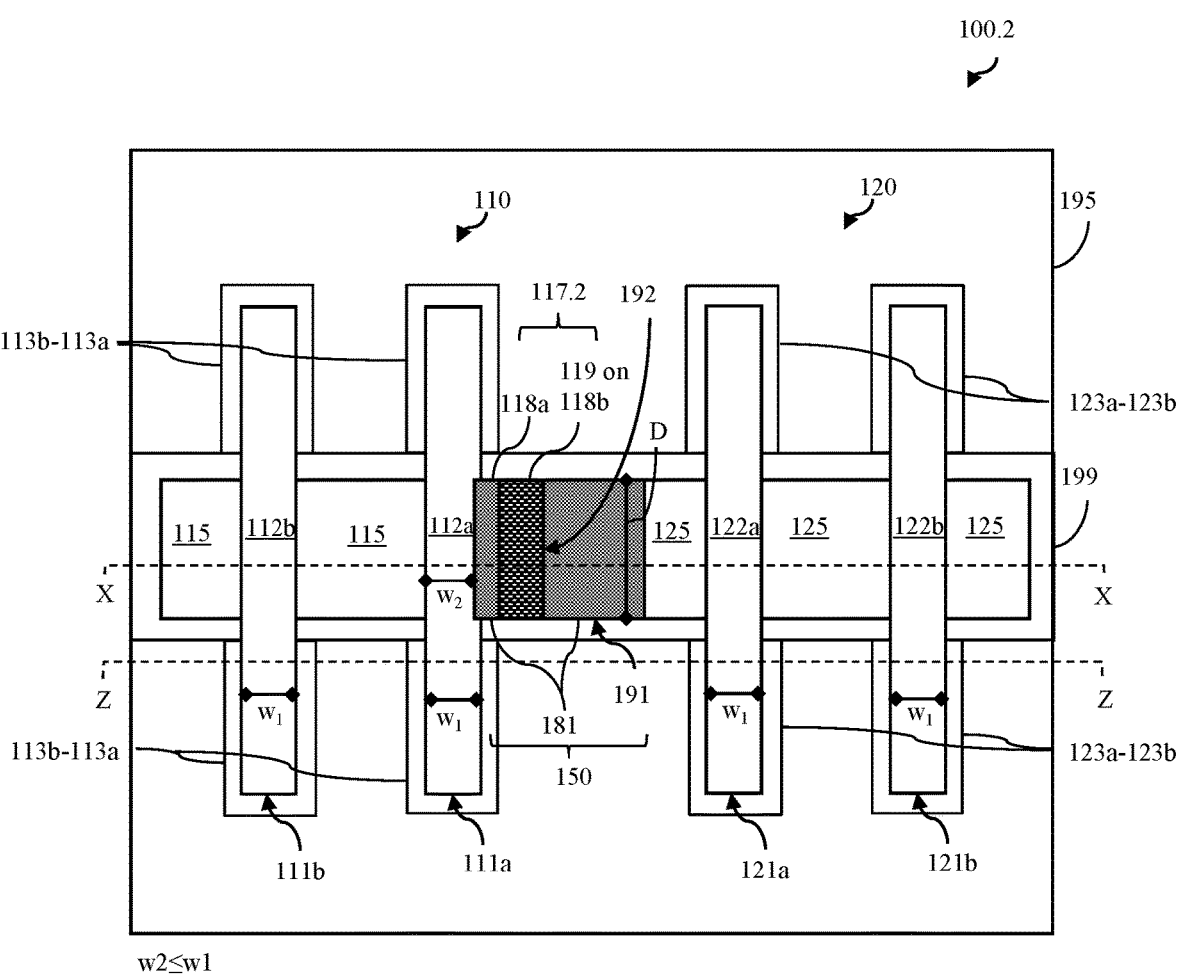
FIG. 1.2A

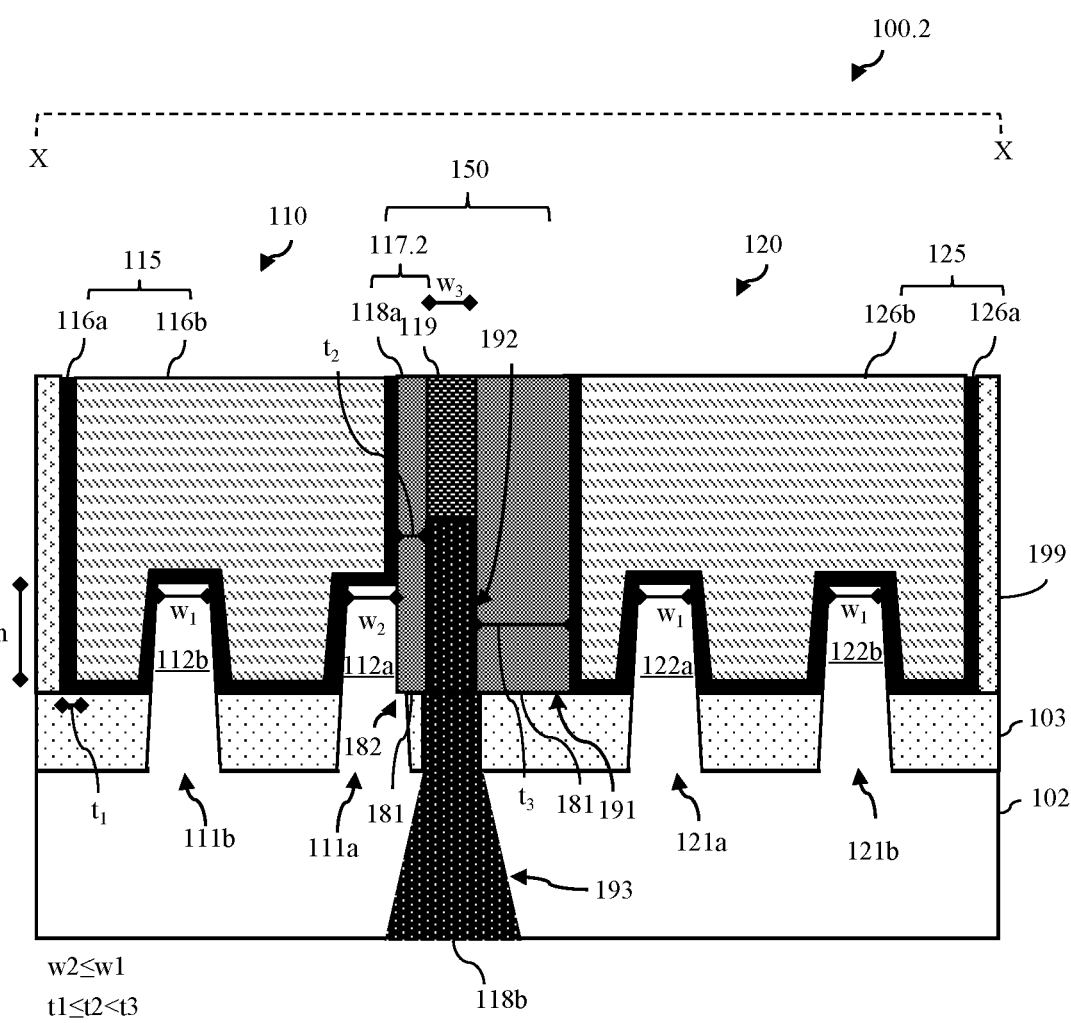
FIG. 1.2B

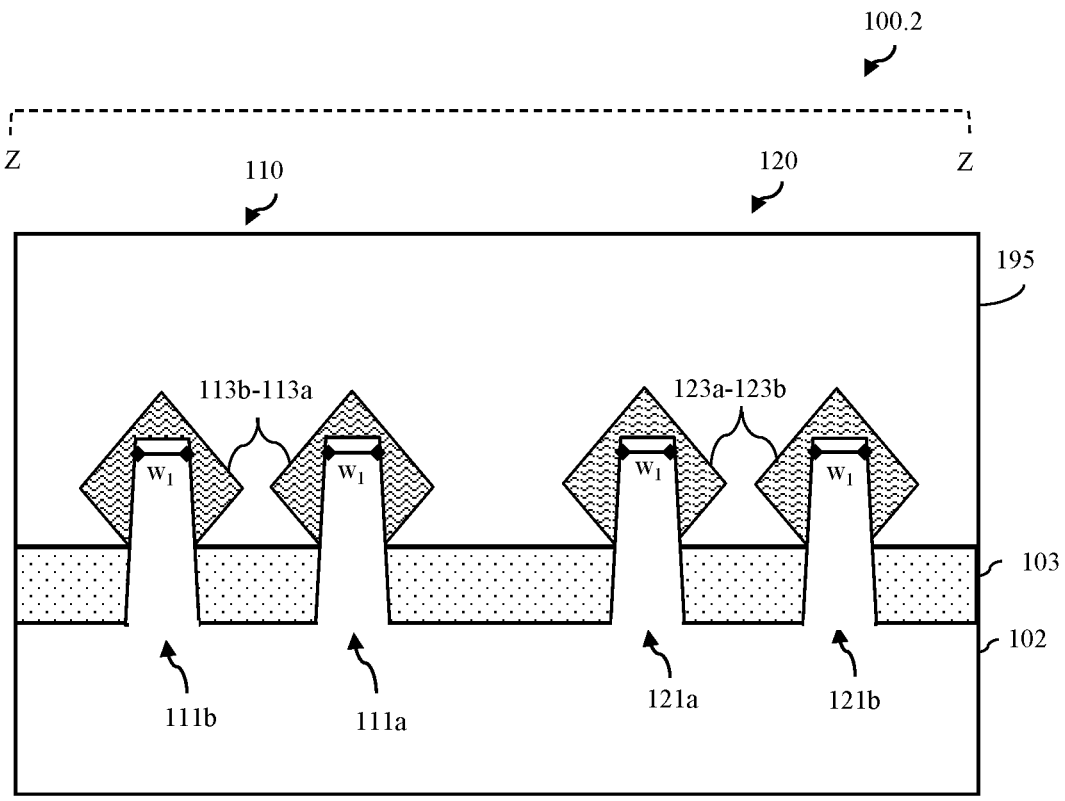
FIG. 1.2C

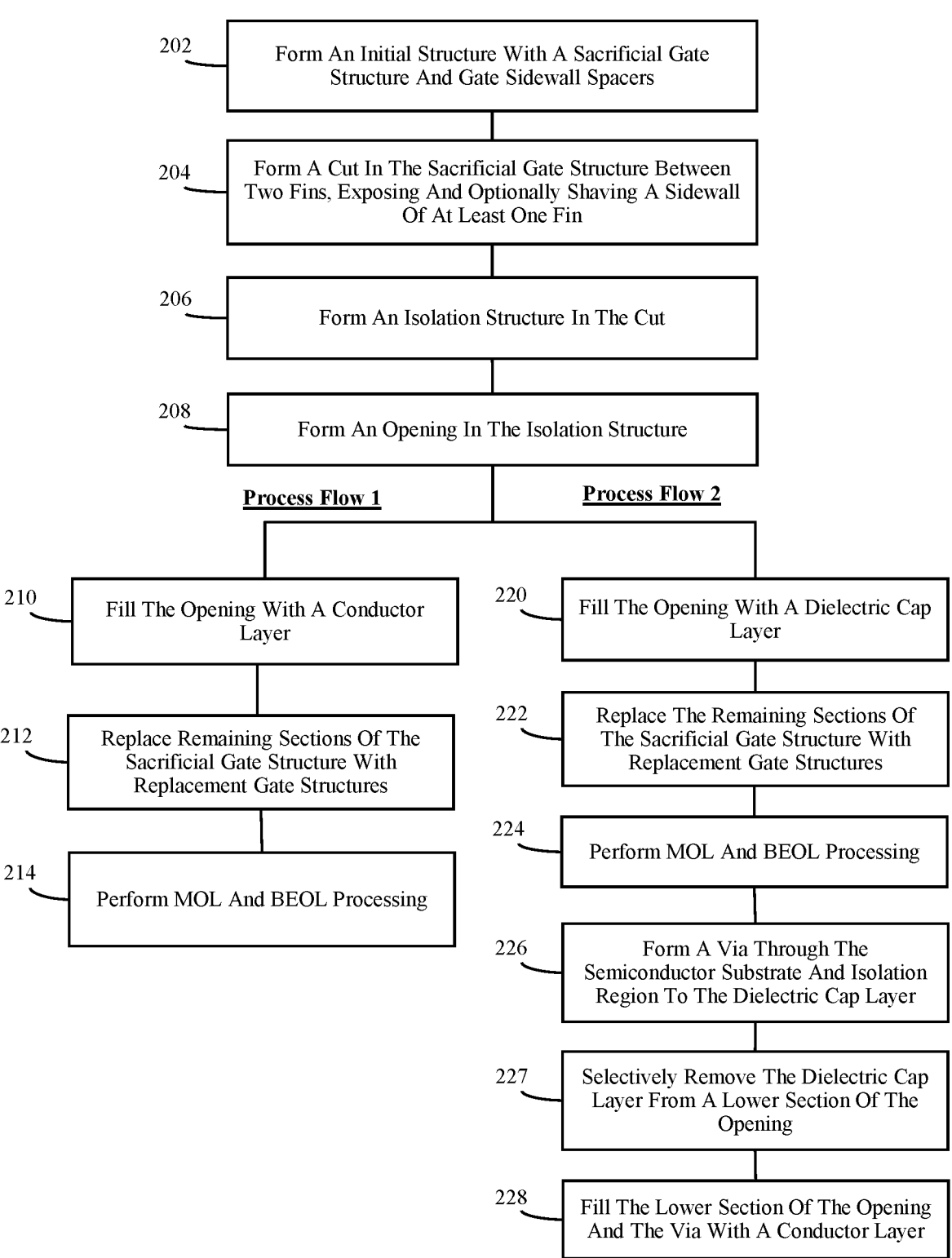

202  Form An Initial Structure With A Sacrificial Gate Structure And Gate Sidewall Spacers 204  Form A Cut In The Sacrificial Gate Structure Between Two Fins, Exposing And Optionally Shaving A Sidewall Of At Least One Fin 206  Form An Isolation Structure In The Cut 208  Form An Opening In The Isolation Structure

Process Flow 1                    Process Flow 2

210  Fill The Opening With A Conductor Layer

220  Fill The Opening With A Dielectric Cap Layer

212  Replace Remaining Sections Of The Sacrificial Gate Structure With Replacement Gate Structures 222  Replace The Remaining Sections Of The Sacrificial Gate Structure With Replacement Gate Structures 214  Perform MOL And BEOL Processing 224  Perform MOL And BEOL Processing 226  Form A Via Through The Semiconductor Substrate And Isolation Region To The Dielectric Cap Layer 227  Selectively Remove The Dielectric Cap Layer From A Lower Section Of The Opening 228  Fill The Lower Section Of The Opening And The Via With A Conductor Layer

FIG. 2

FIN-TYPE FIELD EFFECT TRANSISTOR WITH INDEPENDENTLY BIASABLE SUPPLEMENTARY GATE AND METHOD

BACKGROUND

The present disclosure relates fin-type field effect transistors (FINFETs) and, more particularly, to embodiments of a semiconductor structure including a FINFET and to embodiments of associated methods.

In a single-fin FINFET, a gate structure is formed adjacent to opposing sidewalls and a top surface of a semiconductor fin. Drive current is dependent upon the effective channel width ($W_{eff}$), which is equal to 2h+w, where h is the height of the semiconductor fin, and w is the width at the top of the semiconductor fin. Drive current can be increased by adding semiconductor fins (e.g., by designing a multi-fin FINFET). However, with each added semiconductor fin in the multi-fin FINFET, the amount by which drive current is increased is fixed because the amount by which $W_{eff}$ is increased is fixed. Specifically, in a multi-fin FINFET, the semiconductor fins are essentially identical in height and width and the gate structure is formed adjacent to the top surface and opposing sidewalls of each semiconductor fins. Thus, each additional semiconductor fin included in the multi-fin FINFET adds 2h+w to the overall $W_{eff}$ (i.e., $W_{eff}$=n*(2h+w), where n is the total number of semiconductor fins) and also adds a corresponding fixed amount to the drive current. Furthermore, since single-fin and multi-fin FINFETs have a single gate structure, the threshold voltage (VT) of such FINFETs is also fixed by design. In some applications, being able to fine-tune $W_{eff}$ and VT could be beneficial.

SUMMARY

Disclosed herein are embodiments of a semiconductor structure. The structure can include a first semiconductor fin on a semiconductor substrate and having a top surface and opposing sidewalls. The structure can further include an isolation region on the semiconductor substrate positioned laterally adjacent to the opposing sidewalls. The structure can further include, on the isolation region, an isolation structure and a first gate structure positioned laterally adjacent to the opposing sidewalls, respectively. The first gate structure can further extend laterally over the top surface of the first semiconductor fin and abut the isolation structure. The structure can also include a supplementary gate structure, which is integrated into the isolation structure. Specifically, an opening can extend into the isolation structure adjacent to, but separated from, the first semiconductor fin. The supplementary gate structure can include a conductor layer within the opening and can further include that portion of the isolation structure positioned laterally between the first semiconductor fin and the conductor layer.

In some embodiments, the disclosed semiconductor structure can include a first semiconductor fin on a semiconductor substrate and having a top surface and opposing sidewalls. The structure can further include an isolation region on the semiconductor substrate positioned laterally adjacent to the opposing sidewalls. The structure can further include, on the isolation region, an isolation structure and a first gate structure positioned laterally adjacent to the opposing sidewalls, respectively. The first gate structure can further extend laterally over the top surface of the first semiconductor fin and abut the isolation structure. The structure can further include a supplementary gate structure, which is integrated into the isolation structure. Specifically, an opening can extend vertically through the isolation structure adjacent to, but separated from, the first semiconductor fin. Additionally, a via can extend vertically through the semiconductor substrate and the isolation region to the opening. The supplementary gate structure can include a conductor layer within the opening and can further include that portion of the isolation structure positioned laterally between the first semiconductor fin. In this structure, the conductor layer can also fill the via and a dielectric cap can be within the opening on the conductor layer distal to the semiconductor substrate.

Also disclosed herein are method embodiments for forming such structures. For example, a method can include forming a first semiconductor fin on a semiconductor substrate. The first semiconductor fin can have a top surface and opposing sidewalls. The method can include forming an isolation region on the semiconductor substrate positioned laterally adjacent to the opposing sidewalls. The method can further include forming, on the isolation region, an isolation structure and a first gate structure positioned laterally adjacent to the opposing sidewalls, respectively. The first gate structure can further be formed so that it extends over the top surface of the first semiconductor fin and abuts the isolation structure. The method can further include forming a supplementary gate structure integrated into the isolation structure. The supplementary gate structure can be formed so that it includes: a conductor layer within an opening extending through the isolation structure; and a portion of the isolation structure positioned laterally between the first semiconductor fin and the conductor layer.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 1.1A is a layout diagram and FIGS. 1.1B and 1.1C are different cross-section diagrams of a disclosed embodiment of a semiconductor structure including a FINFET with an independently biasable supplementary gate;

FIG. 1.2A is a layout diagram and FIGS. 1.2B and 1.2C are different cross-section diagrams of another disclosed embodiment of a semiconductor structure including a FINFET with an independently biasable supplementary gate;

FIG. 2 is a flow diagram illustrating method embodiments for forming the semiconductor structures;

DETAILED DESCRIPTION

Figure 3A:
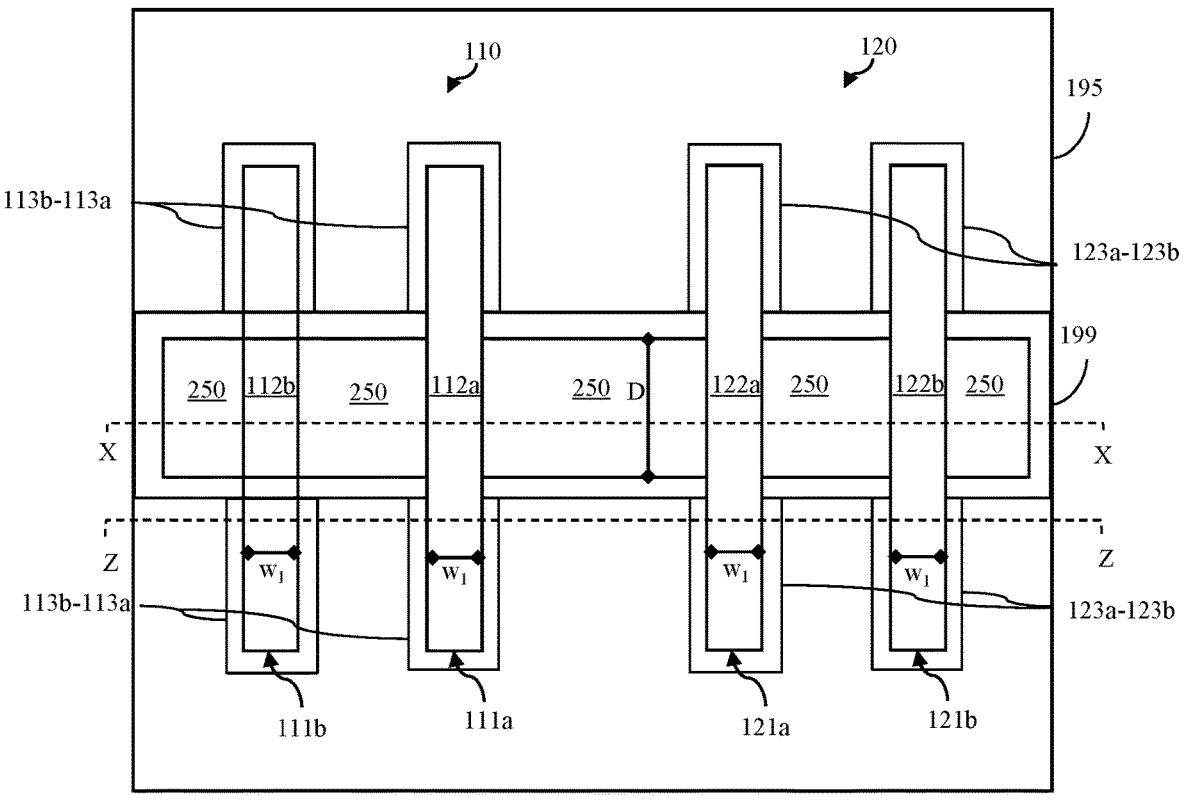
FIG. 3A is a layout diagram and FIGS. 3B and 3C are different cross-section diagrams of a partially completed semiconductor structure formed according to the flow diagram of FIG. 2.

As mentioned above, $W_{eff}$ and VT of single-fin and multi-fin FINFETs are essentially fixed by design. However, in some applications, being able to fine-tune $W_{eff}$ and VT post-manufacture could be beneficial.

In view of the foregoing, disclosed herein are embodiments of a semiconductor structure including a FINFET with an independently biasable supplementary gate structure, a method of forming the semiconductor structure, and a method of operating such a FINFET. Specifically, the semiconductor structure can include at least one semiconductor fin extending upward from a semiconductor substrate and an isolation region on the semiconductor substrate laterally surrounding a lower portion of the semiconductor fin. An upper portion of the semiconductor fin can extend above the level of the top surface of the isolation region. The FINFET can include the upper portion of the semiconductor fin and can further include, on the isolation region, an isolation structure and a gate structure positioned laterally adjacent to the opposing sidewalls, respectively, of the upper portion of the semiconductor fin. The gate structure can further extend over the top surface of the semiconductor fin and abut the isolation structure. Additionally, the FINFET can include an independently biasable supplementary gate structure integrated into the isolation structure. Specifically, an opening can extend into the isolation structure adjacent to, but separated from, the semiconductor fin. The supplementary gate structure can include a conductor layer within the opening and that portion of the isolation structure between the conductor layer and the semiconductor fin. In some embodiments, the conductor layer can be located entirely above the isolation region. In other embodiments, a via can extend from the back side of the substrate through the isolation region to the opening and the conductor layer can fill the via and a lower section of the opening. In this case, a dielectric cap layer can fill an upper section of the opening above the conductor layer distal to the semiconductor substrate. In the FINFET, the supplementary gate structure and, particularly, the conductor layer thereof is independently biased to, for example, effectively fine-tune $W_{eff}$ and thereby selectively adjust VT and improve performance (e.g., achieve a desired switching speed). Such biasing is referred to herein as back-biasing and can include either forward back-biasing (FBB) or reverse back-biasing (RBB) to achieve, for example, a target switching speed. Thus, the FINFET in the disclosed embodiments can be operated in a manner similar to that of a planar fully-depleted semiconductor-on-insulator (e.g., silicon-on-insulator (SOI)) field effect transistor. Also disclosed herein are method embodiments for forming the semiconductor structure and for operating the FINFET.

More particularly, FIG. 1.1A is a layout diagram and FIGS. 1.1B-1.1C are different cross-section diagrams of a disclosed semiconductor structure 100.1. Similarly, FIG. 1.2A is a layout diagram and FIGS. 1.2B-1.2C are different cross-section diagrams of a disclosed semiconductor structure 100.2. Referring to FIGS. 1.1A-1.1C and FIGS. 1.2A-1.2C, in some embodiments, each semiconductor structure 100.1, 100.2 can include a bulk semiconductor substrate 102 (hereinafter referred to as a semiconductor substrate or substrate). The semiconductor substrate 102 can be, for example, a monocrystalline silicon (Si) substrate or a semiconductor substrate of any other suitable monocrystalline semiconductor material (e.g., silicon germanium (SiGe), germanium (Ge), etc.). One or more semiconductor fins can extend upward from the semiconductor substrate 102. That is, they can be patterned and etched into the top surface of the semiconductor substrate 102. For purposes of this disclosure, a "semiconductor fin" refers to a relatively thin, elongated, semiconductor body with a base proximal to the semiconductor substrate 102, a top surface opposite the base and opposing sidewalls. Ideally, a semiconductor fin will have a three-dimensional shape with a uniform width between the opposing sidewalls from the base to the top surface. However, those skilled in the art will recognize that semiconductor fins are typically formed using a selective anisotropic etch process that results in the opposing sidewalls being somewhat angled or curved as opposed to perpendicular relative to the bottom surface of the semiconductor substrate. Thus, the width of a semiconductor fin may be non-uniform between the base and the top surface. For example, semiconductor fins may be wider at the base than they are at the top surface. In some embodiments, a semiconductor fin may have a height of 35-55 nm (e.g., 43 nm), a width at the base of 8-16 nm (e.g., 12 nm), and a width ($w_1$) at the top surface of 6-10 nm (e.g., 8 nm). An isolation region 103 can be on the semiconductor substrate 102 laterally surrounding lower portions of the semiconductor fins with upper portions of the semiconductor fins extending above the level of the top surface of the isolation region 103. The effective fin height (h) of a semiconductor fin can correspond to the height of the upper portion, as measured from the top surface of the isolation region 103 to the top surface of the semiconductor fin. The isolation region 103 can include one or more layers of isolation material (e.g., a silicon dioxide ($SiO_2$) or any other suitable isolation material).

In other embodiments (not shown), instead of the semiconductor fins being etched into the top surface of a semiconductor substrate, such semiconductor fins could be etched into a semiconductor layer (e.g., a monocrystalline Si layer or a layer of some other suitable monocrystalline semiconductor material) of a semiconductor-on-insulator structure (e.g., a silicon-on-insulator (SOI) structure) such that each semiconductor fin extends upward from the top surface of an insulator layer.

In any case, each semiconductor structure 100.1, 100.2 can include at least a first FINFET 110 and, optionally, a second FINFET 120. The first FINFET 110 can include one or more first semiconductor fins (e.g., see first semiconductor fins 111*a*-111*b*) so as to be a single-fin FINFET or a multi-fin FINFET. Optional second FINFET 120 can include one or more second semiconductor fins (e.g., see second semiconductor fins 121*a*-121*b*) parallel to the first semiconductor fin(s) so as to be a single-fin FINFET or a multi-fin FINFET. For purposes of illustration, the first FINFET 110 and optional second FINFET 120 are both shown as being two-fin FINFETs. However, it should be understood that the first FINFET 110 and the optional second FINFET 120 could include any number of one or more semiconductor fins.

As discussed in greater detail below and illustrated in the figures, the first FINFET 110 includes a first gate structure 115 (also referred to herein as a primary gate structure) and an independently biasable supplementary gate structure 117.1 (e.g., see the first FINFET 110 in the embodiment of the semiconductor structure 100.1 of FIGS. 1.1A-1.1C) or 117.2 (e.g., see the first FINFET 110 in the embodiment of the semiconductor structure 100.2 of FIGS. 1.2A-1.2C). The optional second FINFET 120 can include a second gate structure 125 without a supplementary gate structure (as illustrated) or, alternatively, with a supplementary gate structure (not shown).

In any case, within the first FINFET 110, the first semiconductor fins 111a-111b can include corresponding first channel regions 112a-112b positioned laterally between first source/drain regions 113a-113b. The first gate structure 115 can be above the isolation region 103 adjacent to the first semiconductor fins 111a-111b at the first channel regions 112a-112b therein. Within the optional second FINFET 120, the second semiconductor fins 121a-121b can include corresponding second channel regions 122a-122b positioned laterally between second source/drain regions 123a-123b. A second gate structure 125 can be above the isolation region 103 adjacent to the second semiconductor fins 121a-121b at the second channel regions 122a-122b therein.

The first FINFET 110 and optional second FINFET 120 can be N-channel FINFETs (NFETs), P-channel FINFETs (PFETs) or a combination of both (e.g., an NFET and a PFET, respectively, or a PFET and an NFET, respectively). Those skilled in the art will recognize that, typically, the channel region(s) of an NFET can be undoped (i.e., intrinsic) or, alternatively, doped so as to have P-type conductivity at a relatively low conductivity level (i.e., P– conductivity) and the source/drain regions can be doped so as to have N-type conductivity at a relatively high conductivity level (i.e., N+ conductivity or higher). The channel regions(s) of a PFET can be undoped (i.e., intrinsic) or, alternatively, doped so as to have N-type conductivity at a relatively low conductivity level (i.e., N– conductivity) and the source/drain regions can be doped so as to have P-type conductivity at a relatively high conductivity level (i.e., P+ conductivity or higher). Furthermore, those skilled in the art will recognize that various different source/drain configurations are known in the art and could be incorporated the first FINFET 110 and the optional second FINFET 120 (if present). For example, the source/drain regions 113a-113b, 123a-123b can include, for example, in situ doped epitaxial semiconductor material grown on the top surface and opposing sidewalls of the semiconductor fins (as illustrated) or, alternatively, within source/drain recesses within the semiconductor fins. The epitaxial semiconductor material on adjacent semiconductor fins can be physically separated such that each fin has discrete source/drain regions, as illustrated. Alternatively, the epitaxial semiconductor material on adjacent semiconductor fins can be merged so that the semiconductor fins have shared source/drain regions. Alternatively, the source/drain regions can have any other suitable source/drain region configuration known in the art.

Each semiconductor structure 100.1, 100.2 can further include an isolation structure 150 (also referred to herein as a gate cut isolation structure) within a gate cut opening 191, which is above the isolation region 103 and positioned laterally adjacent to the first gate structure 115 of the first FINFET 110 and, if applicable, positioned laterally between and adjacent to the first gate structure 115 and the second gate structure 125 of the second FINFET 120. The isolation structure 150 can include an essentially rectangular-shaped isolation structure including one or more layers of isolation material 181. The isolation material 181 of the isolation structure 150 can include, for example, an oxide (e.g., $SiO_2$), a carbon-doped oxide dielectric (e.g., SiCOH), or any other suitable isolation material (e.g., SiON).

Each semiconductor structure 100.1, 100.2 can further include gate sidewall spacers 199 (hereinafter referred to as sidewall spacers). The sidewall spacers 199 can define an essentially rectangular-shaped gate opening within which the first gate structure 115, the isolation structure 150 and, if applicable, the second gate structure 125 are formed during processing (as discussed in detail below with regard to the method embodiments). Thus, the sidewall spacers 199 are adjacent to opposing sides of the first gate structure 115 (thereby electrically isolating the first gate structure 115 from the first source/drain regions), adjacent to opposing sides of the isolation structure 150, and, if applicable, adjacent to opposing sides of the second gate structure 125 (thereby electrically isolating the second gate structure 125 from the second source/drain regions). It should be noted that the distance (D) between the sidewall spacers 199 on the opposing sides of the structures 115, 125 and 150 can be essentially uniform and each of these structures 115, 125 and 150 extend laterally that full distance (D) so that in the direction parallel to the first semiconductor fin they have the same dimension. In the illustrated embodiments, sidewall spacers 199 are also shown as being on the ends of the first gate structure 115 and the second gate structure 125 opposite the isolation structure 150. The sidewall spacers 199 can include one or more layers of dielectric sidewall spacer material (e.g., SiN, carbon-doped SiN, silicon boron carbon nitride (SiBCN) or any other suitable dielectric sidewall spacer material).

The isolation structure 150 can further be immediately adjacent to one sidewall of the first semiconductor fin 111a at the first channel region 112a. As discussed in greater detail below with regard to the method embodiments, processing used to pattern and etch the gate cut opening 191 for the isolation structure 150 can shave down the sidewall of the first semiconductor fin 111a at the first channel region 112a, thereby forming a groove 182, which extends from the top surface of the first semiconductor fin 111a downward to the top surface of the isolation region 103. As shown, the isolation structure 150 can be seated within (i.e., can fill) the groove 182. As a result, the width ($w_2$) of the top surface of the first semiconductor fin 111a at the first channel region 112a can be equal to or less than the width ($w_1$) of the top surface of the first semiconductor fin 111a in the first source/drain regions 113a. That is, $w_2 \leq w_1$ and can range from ~1/10*$w_1$ to $w_1$. As illustrated, the height of the isolation structure 150 can be greater than the height of the semiconductor fins.

The first gate structure 115 of the first FINFET 110 can include a conformal gate dielectric layer 116a, including one or more layers of gate dielectric material, and a gate conductor layer 116b, including one or more layers of gate conductor material. The first gate structure 115 can be above the isolation region 103, positioned laterally immediately adjacent to the sidewall of the first semiconductor fin 111a opposite the isolation structure 150 at the first channel region 112a and can further extend over the top surface of the first semiconductor fin 111a at the first channel region 112a to the isolation structure 150. As indicated, conformal gate dielectric layer 116a can be relatively thin (e.g., see gate dielectric thickness (t1)). First gate structure 115 can be, for example, a replacement metal gate (RMG). An RMG can include, for example: a high-K gate dielectric layer; a work function metal layer on the high-K gate dielectric layer; an optional doped polysilicon gate conductor layer on the work function metal layer; and an optional metal silicide layer on the doped polysilicon gate conductor layer. As discussed in greater detail below with regard to the method embodiments, the isolation structure 150 can be formed within a sacrificial gate structure prior to RMG formation or within an already formed RMG. If the isolation structure 150 is formed within the sacrificial gate structure prior to RMG formation, the portion of the sidewall of the isolation structure 150 immediately adjacent to the first gate structure 115 would be covered with gate dielectric layer 116a, as illustrated. However, if the isolation structure 150 is formed post-RMG processing, the portion of the sidewall of the isolation structure 150 immediately adjacent to the first gate structure 115 would be in contact with the gate conductor layer 116b (not shown). See the detailed discussion of RMG materials below.

Those skilled in the art will recognize that by positioning the relatively tall isolation structure 150 immediately adjacent to the first semiconductor fin 111a and the portion of the first gate structure 115 above the first semiconductor fin 111a and further by optionally reducing the width of the top surface of the first semiconductor fin 111a at the first channel region 112a to $w_2$, the contribution of the first channel region 112a to the overall effective channel width ($W_{eff}$) of the first FINFET 110 is effectively reduced by design to $h*w_2$ (as opposed to $2h*w_1$).

As mentioned above, the first FINFET 110 can further include a supplementary gate structure (e.g., see supplementary gate structure 117.1 in FIGS. 1.1A-1.1C; see also the supplementary gate structure 117.2 in FIGS. 1.2A-1.2C). The supplementary gate structure 117.1, 117.2 is independently biasable to fine-tune $W_{eff}$ and thereby selectively adjust VT during operation. More particularly, the supplementary gate structure 117.1, 117.2 can be integrated into the isolation structure 150 and can include: a conductor layer 118b within an additional opening 192 that extends into the isolation structure 150; and a portion 118a of the isolation structure 150 that is positioned laterally between and immediately adjacent to both the first semiconductor fin 111a and the conductor layer 118b. As illustrated, the additional opening 192 can be parallel to the first semiconductor fin 111a, can traverse the isolation structure 150 the full distance (D) between sidewall spacers 199, and can extend vertically down to the top surface of the isolation region 103. Thus, placement of the additional opening 192 defines the thickness ($t_2$) of the portion 118a of the isolation structure 150 immediately adjacent to the first semiconductor fin 111a. The additional opening 192 can, for example, divide the isolation structure 150 into two discrete portions including the portion 118a and an additional portion between the additional opening 192 and the second gate structure 125 of the optional second FINFET 120, if applicable. The thickness ($t_2$) of the portion 118a can be less than 20 nm (e.g., 10-15 nm or even less) and also less than the thickness ($t_3$) of the additional portion of the isolation structure 150 on the opposite side of the additional opening 192 (which can range, for example, 35 nm-50 nm). Thus, the conductor layer 118b can be closer to the first semiconductor fin 111a and the first gate structure 115 than it is to the second gate structure 125 or second semiconductor fin 121a of the optional second FINFET 120, if applicable. In some embodiments, the thickness ($t_2$) of portion 118a can also be greater than the thickness ($t_1$) of the conformal gate dielectric layer 116a of the first gate structure 115. Additionally, in some embodiments, the width ($w_3$) of the additional opening 192 as measured between adjacent portions of the isolation structure 150 can be less than 50 nm (e.g., 25-30 nm or less) such that the thickness of the conductor layer 118b therein is also less than 50 nm.

In the supplementary gate structure 117.1 of FIGS. 1.1A-1.1C, the conductor layer 118b can completely fill the additional opening 192. In these embodiments, the top surfaces of conductor layer 118b, sidewall spacers 199, and isolation structure 150 could be approximately coplanar (e.g., +/− a few nanometers). Additionally, in these embodiments, conductor layer 118b can be contacted, for independent biasing, by a MOL contact (not shown). In the supplementary gate structure 117.2 of FIGS. 1.2A-1.2C, an upper section of the additional opening 192 can be filled with a dielectric cap 119 (e.g., a SiN cap or a cap of some other suitable dielectric material different from the isolation material 181 of the isolation structure 150). In these embodiments, top surfaces of dielectric cap 119, sidewall spacers 199, and isolation structure 150 could be approximately co-planar (e.g., +/− a few nanometers). Additionally, in these embodiments, a via 193 can extend through semiconductor substrate 102 from the back side and further through the isolation region 103 to the bottom of the additional opening 192. Optionally, the via 193 can be wider than the opening; however, the via should be separated from any of the semiconductor fins by isolation material of the isolation region. The conductor layer 118b can fill the lower section of the additional opening 192 directly below the dielectric cap 119 and can further fill the via 193. Thus, in these embodiments, the conductor layer 118b can be contacted, for independent biasing, via the back side of the semiconductor substrate 102. In any case, in the disclosed embodiments, conductor layer 118b can be any suitable conductor material that can be employed during middle of the line (MOL) processing (e.g., in the case of the supplementary gate structure 117.1) or back end of the line (BEOL) processing (e.g., in the case of the supplementary gate structure 117.2) to fill openings and/or vias. For example, the conductor layer 118b could include one or more metal or metal alloy layers (e.g., tungsten, cobalt, or any other metal or metal alloy material). Alternatively, the conductor layer 118b could include doped polysilicon.

As mentioned above, independent biasing of the supplementary gate structure 117.1, 117.2 can be employed to effectively fine-tune the overall effective channel width ($W_{eff}$) of the first FINFET 110 and thereby selectively adjust VT (e.g., to improve performance, such as achieve a desired switching speed). Such biasing is referred to herein as back-biasing and can include either forward back-biasing (FBB) or reverse back-biasing (RBB) to achieve, for example, a target switching speed. FBB specifically to applying a voltage that will reduce the VT of the FET, thereby increasing the switching speed. Generally, for PFET, FBB can be achieved by applying a negative voltage to the supplemental gate structure; whereas, for an NFET, FBB is achieved by applying a positive voltage to the supplemental gate structure. RBB refers specifically to applying a voltage that will increase the VT of the FET, thereby decreasing the switching speed and reducing leakage current. Generally, for a PFET, RBB is achieved by applying a positive voltage to the supplemental gate structure; whereas, for an NFET, RBB is achieved by applying a negative voltage to the supplemental gate structure. Thus, the FINFET in the disclosed embodiments can be operated in a manner similar to that of a planar fully-depleted semiconductor-on-insulator (e.g., silicon-on-insulator (SOI)) field effect transistor.

As mentioned above, the optional second FINFET 120 can have a second gate structure 125. The second gate structure 125 can include a conformal gate dielectric layer 126a, including one or more layers of gate dielectric material, and a gate conductor layer 126b, including one or more layers of gate conductor material. In some embodiments, as illustrated, the second gate structure 125 can be above the isolation region 103, positioned laterally immediately adjacent to the opposing sidewalls and top surfaces of each second semiconductor fin 121a-121b and can abut one side of the isolation structure 150 opposite the first FINFET 110. Thus, in these embodiments, the second FINFET 120 is devoid of a supplementary gate structure. In other embodiments (not shown), the isolation structure 150 could abut one sidewall of the second semiconductor fin 122a at the second channel region 122a. In this case, the optional second FINFET 120 could be either devoid of a supplementary gate structure or could include a supplementary gate structure integrated into the isolation structure 150 in the same manner as either of the supplementary gate structures 117.1 or 117.2 discussed above. In any case, like the first gate structure 115, the second gate structure 125 can be an RMG. As discussed in greater detail below with regard to the method embodiments, the isolation structure 150 can be formed within a sacrificial gate structure prior to RMG formation or within an already formed RMG. If the isolation structure 150 is formed within the sacrificial gate structure prior to RMG formation, the sidewall of the isolation structure 150 immediately adjacent to the second gate structure 125 would be covered with gate dielectric layer 126a, as illustrated. However, if the isolation structure 150 is formed post-RMG processing, the sidewall of the isolation structure 150 immediately adjacent to the second gate structure 125 would be in contact with the gate conductor layer 126b (not shown). The gate dielectric and conductor materials of the second gate structure can be the same as or different from the gate dielectric and conductor materials of the first gate structure. See the detailed discussion of RMG materials below.

In any case, source/drain regions 113a-113b, 123a-123b can be covered with one or more middle of the line (MOL) dielectric layer(s) 195. Specifically, MOL dielectric layer(s) 195 can be on the top surface of the isolation region filling space around and between the semiconductor fins and source/drain regions and further extending over the source/drain regions. The MOL dielectric layer(s) 195 can include, for example, an optional etch stop layer and a blanket interlayer dielectric (ILD) material layer on the etch stop layer. The optional etch stop layer can be, for example, a relatively thin conformal SiN layer or a relatively thin conformal layer of some other suitable etch stop material. The blanket ILD material layer can be, for example, a blanket layer of SiO₂ layer, a doped silicon glass layer (e.g., phosphosilicate glass (PSG) or borophosphosilicate glass (BPSG)), or a blanket layer of any other suitable ILD material.

The semiconductor structures 100.1, 100.2 can further include various MOL and BEOL features. Such features are well known in the art and, thus, the details thereof have been omitted from the specification and drawings in order to allow the reader to focus on the salient aspects of the disclosed embodiments.

Referring to the flow diagram of FIG. 2, also disclosed herein are embodiments of a method of forming the semiconductor structures disclosed herein. For purposes of illustration, the embodiments of the method are described herein with respect to formation of the semiconductor structures 100.1 (as illustrated in FIGS. 1.1A-1.1C) and 100.2 (as illustrated in FIGS. 1.2A-1.2C).

Figure 3B:
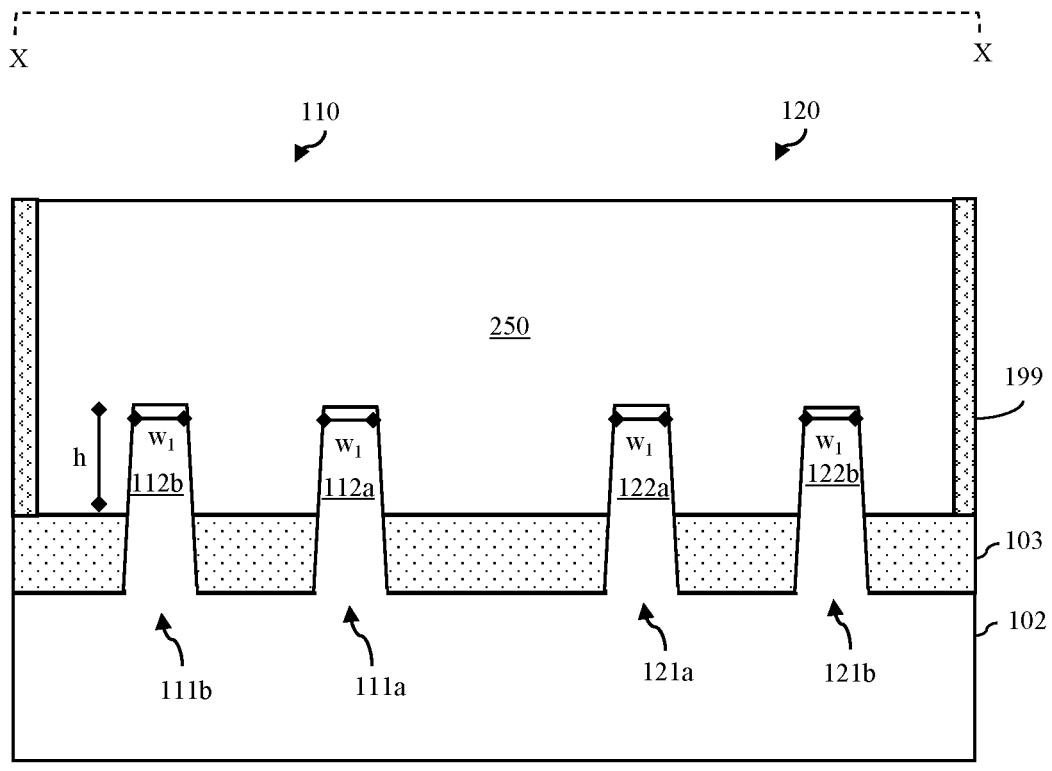
Figure 3C:
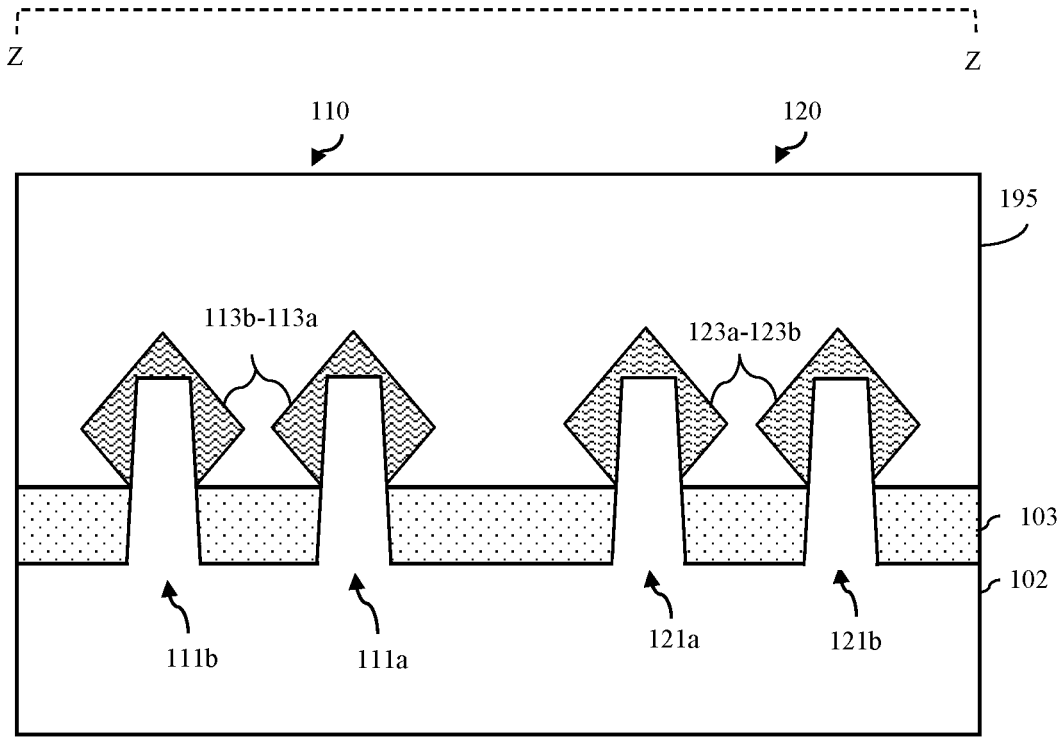

The method can include forming a partially completed semiconductor structure including a first FINFET 110 and optional second FINFET 120 with a shared sacrificial gate structure 250 and gate sidewall spacers 199 (see process 202 and FIGS. 3A-3C).

Specifically, at process 202, multiple parallel semiconductor fins can be formed on a semiconductor substrate 102. The semiconductor fins can include one or more first semiconductor fin 111a-111b for the first FINFET 110 and one or more second semiconductor fin 121a-121b for the optional second FINFET 120. The semiconductor fins can be formed using conventional semiconductor fin formation techniques (e.g., sidewall image transfer (SIT) techniques, lithographic patterning and etch techniques, or any other suitable semiconductor fin formation technique(s)). In some embodiments, the semiconductor fins can be patterned and etched into the top surface of a semiconductor substrate 102 such that they extend essentially vertically upwards from a remaining portion of the semiconductor substrate 102 below. This semiconductor substrate 102 can be, for example, a monocrystalline Si substrate or a semiconductor substrate of any other suitable monocrystalline semiconductor material (e.g., SiGe, Ge, etc.). After semiconductor fin formation on a semiconductor substrate, an isolation region 103 that laterally surrounds lower portions of the semiconductor fins can be formed. For example, one or more layers of isolation material can be deposited over the partially completed structure and etched back (e.g., recessed) so that upper portions of the semiconductor fins extend some height (h) above the level of the top surface of isolation region 103. The isolation material can, for example, be silicon dioxide (SiO₂) or any other suitable isolation material. Alternatively, the semiconductor fins could be patterned and etched through a semiconductor layer (e.g., a monocrystalline Si layer or a layer of some other suitable monocrystalline semiconductor material) of a semiconductor-on-insulator structure (e.g., an SOI structure).

A sacrificial gate structure 250 can then be formed. For example, one or more sacrificial layers can be deposited over the partially completed structure. The sacrificial layers can include, for example, a conformal oxide layer and a blanket polysilicon layer on the conformal oxide layer. The sacrificial layers can also include a hard mask layer (e.g., a SiN hard mask layer) on the polysilicon layer. Conventional lithographic patterning and etch techniques can then be performed to pattern the layers of sacrificial materials into the sacrificial gate structure 250. As illustrated, sacrificial gate structure 250 can be an essentially rectangular-shaped body that traverses the semiconductor fins and, more particularly, is adjacent to the top surface and opposing sidewalls of each semiconductor fin at designated channel regions.

Conventional sidewall spacer formation techniques can then be performed to form dielectric gate sidewall spacers 199 on the sidewalls of sacrificial gate structure 250. For example, a layer of dielectric sidewall spacer material (e.g., SiN, carbon-doped SiN, SiBCN or any other suitable dielectric sidewall spacer material) can be conformally deposited over the partially completed structure. The dielectric sidewall spacer material can then be anisotropically etched, removing it from essentially horizontal surfaces and leaving it intact, as gate sidewall spacers 199, on essentially vertical surfaces.

In situ doped epitaxial semiconductor material can be grown on exposed surfaces of semiconductor fins 111a-111b, 121a-121b on either side of sacrificial gate structure 250, thereby forming source/drain regions 113a-113b, 123a-123b. Those skilled in the art will recognize that whether the epitaxial semiconductor material is doped so as to have P-type conductivity or N-type conductivity depends upon whether the FINFETs being formed are NFETs, PFETs, an NFET and a PFET or a PFET and an NFET. If FETs with different type conductivity are being formed, discrete masked epitaxial deposition processes can be performed. In any case, for NFET(s), the channel regions can be undoped (i.e., intrinsic) or, alternatively, doped so as to have P-type conductivity at a relatively low conductivity level (i.e., P– conductivity) and the source/drain regions can be doped so as to have N-type conductivity at a relatively high conductivity level (i.e., N+ conductivity or higher). For PFET(s), the channel regions can be undoped (i.e., intrinsic) or, alternatively, doped so as to have N-type conductivity at a relatively low conductivity level (i.e., N– conductivity) and the source/drain regions can be doped so as to have P-type conductivity at a relatively high conductivity level (i.e., P+ conductivity or higher).

One or more MOL dielectric layer(s) 195 can be formed (e.g., deposited) over the partially completed semiconductor structure. MOL dielectric layer(s) 195 can include, for example, an optional etch stop layer and a blanket interlayer dielectric (ILD) material layer on the etch stop layer. The optional etch stop layer can be, for example, a relatively thin conformal SiN layer or a relatively thin conformal layer of some other suitable etch stop material. The blanket ILD material layer can be, for example, a blanket layer of $SiO_2$ layer, a doped silicon glass layer (e.g., phosphosilicate glass (PSG) or borophosphosilicate glass (BPSG)), or a blanket layer of any other suitable ILD material. A polishing process (e.g., a chemical mechanical polishing (CMP) process) can then be performed in order to expose sacrificial gate structure (e.g., the polysilicon layer thereof).

As discussed above with regard to the structure embodiments, in the final structure an isolation structure 150 can be positioned laterally between and immediately adjacent to a first gate structure 115 for the first FINFET 110 and the second gate structure 125 for the optional second FINFET 120. The first gate structure 115 and the second gate structure 125 can be RMGs. In some embodiments, the isolation structure 150 can be formed before sacrificial gate structure removal. That is, the isolation structure 150 (also referred to herein as gate cut isolation structures) can be formed in the sacrificial gate structure 250 (and partly into the first semiconductor fin 111a) using conventional trench isolation formation techniques to selectively adjust the overall $W_{eff}$ of the resulting first FINFET 110 (see processes 204-206).

Figure 4A:
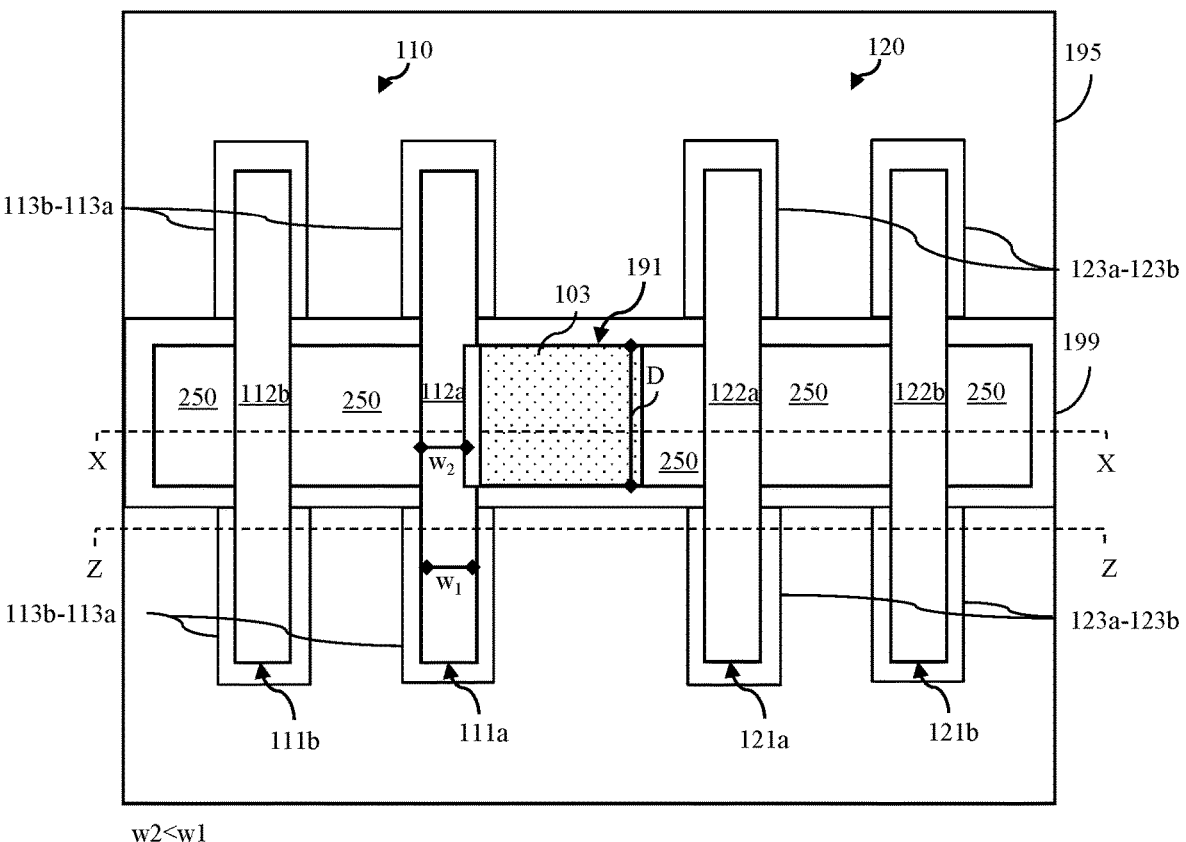
FIG. 4A is a layout diagram and FIG. 4B is a cross-section diagram of a partially completed semiconductor structure formed according to the flow diagram of FIG. 2.
Figure 4B:
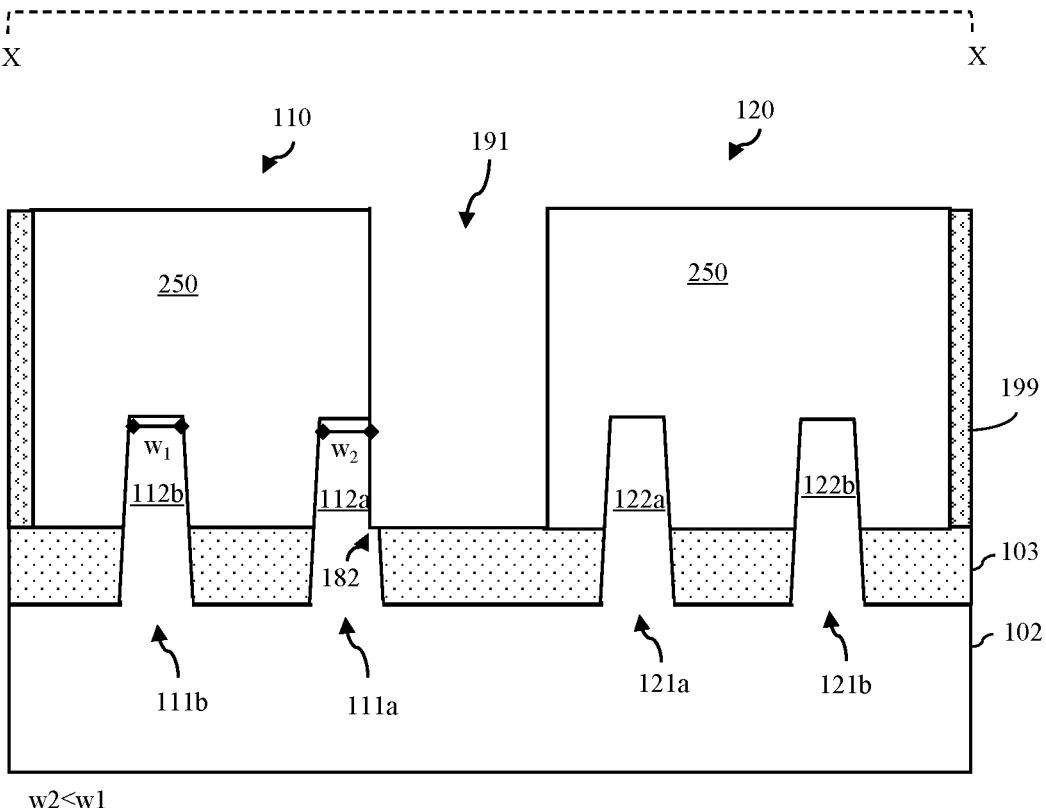

For example, a mask layer can be formed over the partially completed structure and an opening can be formed in the mask layer (e.g., using conventional lithographic processing and etch techniques) to expose a section of the sacrificial gate structure 250 within which the isolation structure 150 is to be formed. Patterning of the mask opening can be such that one side is either aligned with a sidewall of the first semiconductor fin 111a or aligned somewhere above the top surface of the first semiconductor fin 111a. Then, one or more anisotropic etch processes can be performed to etch a gate cut opening 191 (or trench) in the exposed section of the sacrificial gate structure 250 down to the isolation region 103 (see process 204 and FIGS. 4A-4B). Optionally, the anisotropic etch process(es) used to form the gate cut opening 191 can be selective for the sacrificial gate material (e.g., polycrystalline silicon) over any exposed dielectric material. However, it can be non-selective with respect to the sacrificial gate material (e.g., polycrystalline silicon) over the semiconductor fin material (e.g., monocrystalline silicon). If the first semiconductor fin 111a is relatively wide at the base or if the mask opening exposes an area of the top surface of the first semiconductor fin 111a and if the anisotropic etch processes are not selective over silicon, a groove 182 can be formed in the exposed sidewall of the first semiconductor fin 111a from the top surface down to the isolation region 103. Thus, following formation of the gate cut opening 191, the width ($w_2$) of the first semiconductor fin 111a at the first channel region 112a can be equal to or less than the width ($w_1$) of the top surface of the first semiconductor fin 111a in the first source/drain regions 113a. That is, $w_2 \le w_1$ and can range from $\sim \frac{1}{10} w_1$ to $w_1$.

Figure 5A:
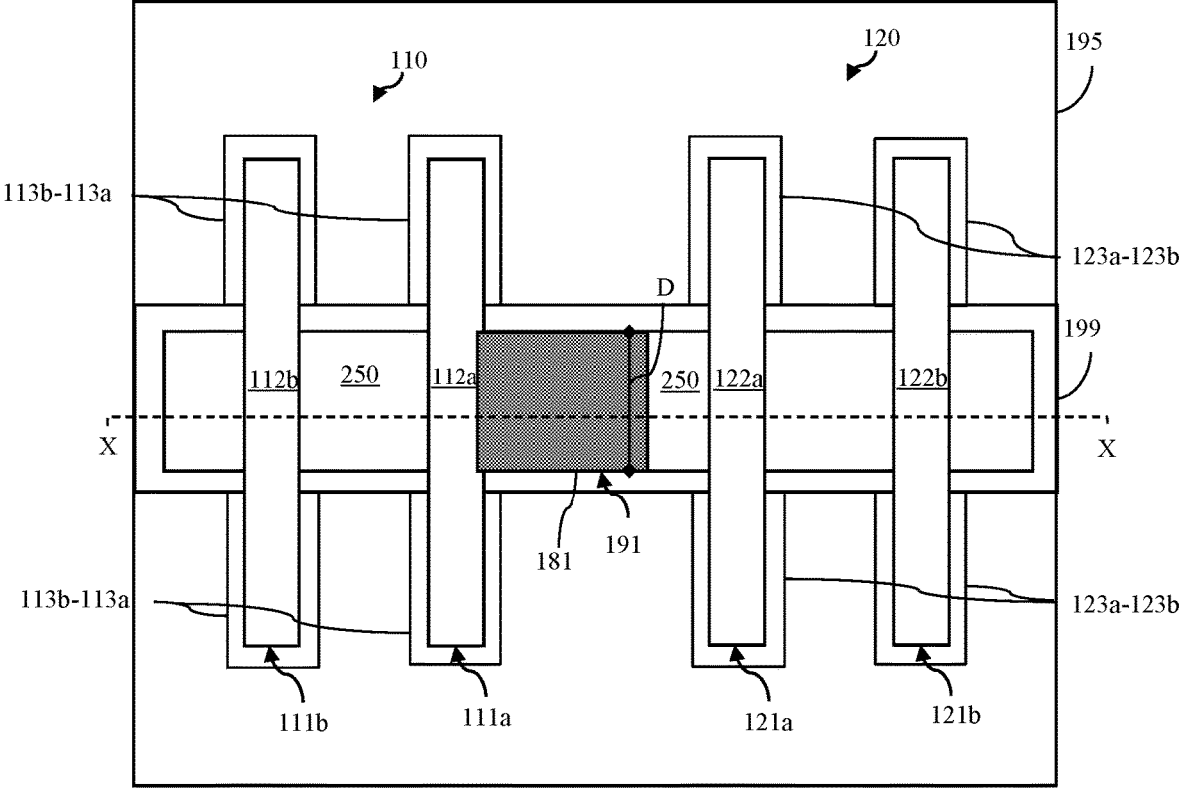
FIG. 5A is a layout diagram and FIG. 5B is a cross-section diagram of a partially completed semiconductor structure formed according to the flow diagram of FIG. 2.
Figure 5B:
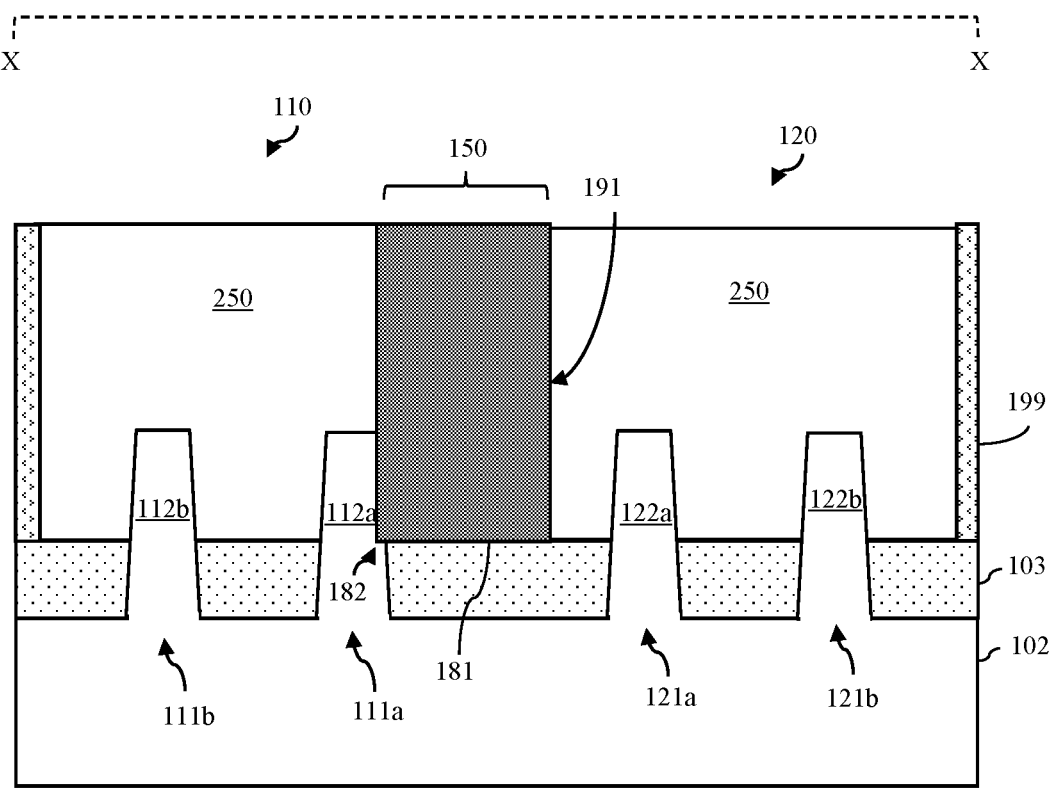

The mask layer can be removed and the isolation structure 150 can be formed in the gate cut opening 191 immediately adjacent to the exposed sidewall of the first semiconductor fin 111a (e.g., seated within groove 182) (see process 206 and FIGS. 5A-5B). For example, one or more layers of isolation material can be deposited so as to fill the gate cut opening 191. The isolation material can include, for example, an oxide (e.g., $SiO_2$), a carbon-doped oxide (e.g., SiCOH), or any other suitable isolation material (e.g., SiON). Then, a polishing process (e.g., a CMP process) can be performed to remove any isolation material from above the first gate structure 115 and the second gate structure 125. A polishing process (e.g., a chemical mechanical polishing (CMP) process) can then be performed to remove any of the isolation materials form the top surface of the sacrificial gate structure 250.

Figure 6A:
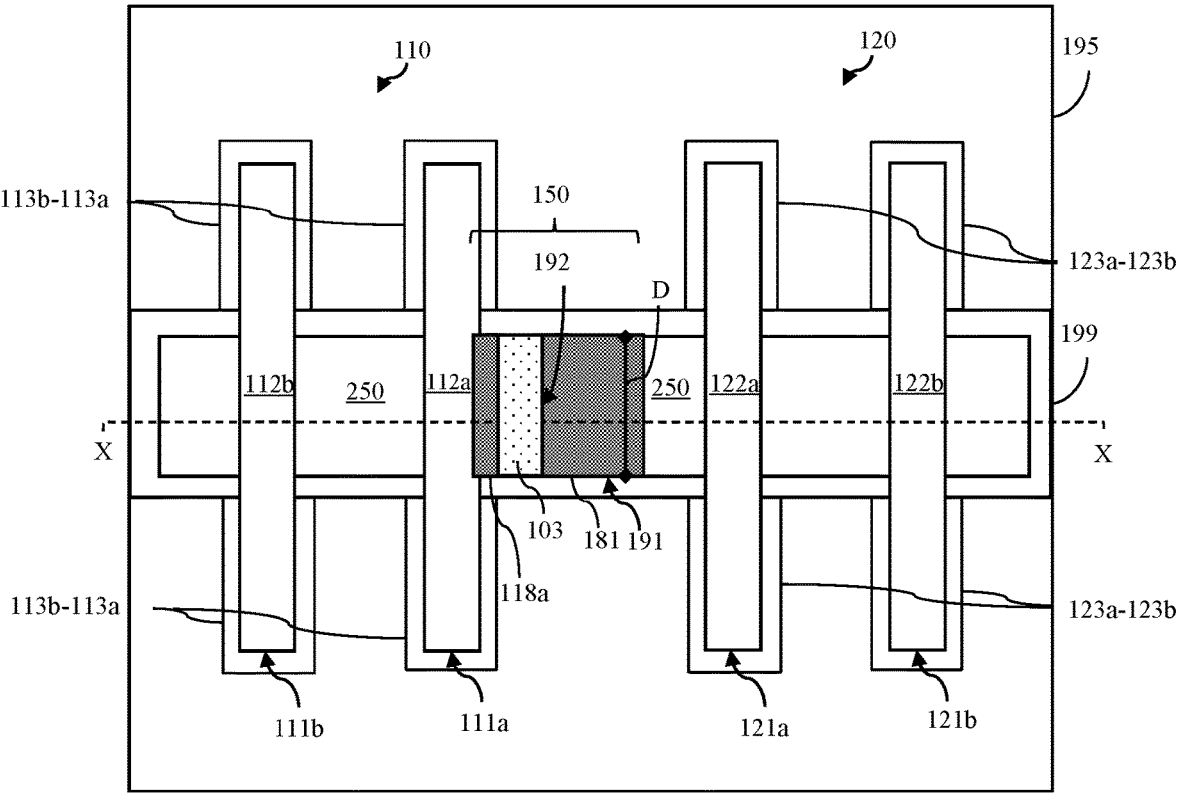
FIG. 6A is a layout diagram and FIG. 6B is a cross-section diagram of a partially completed semiconductor structure formed according to the flow diagram of FIG. 2.
Figure 6B:
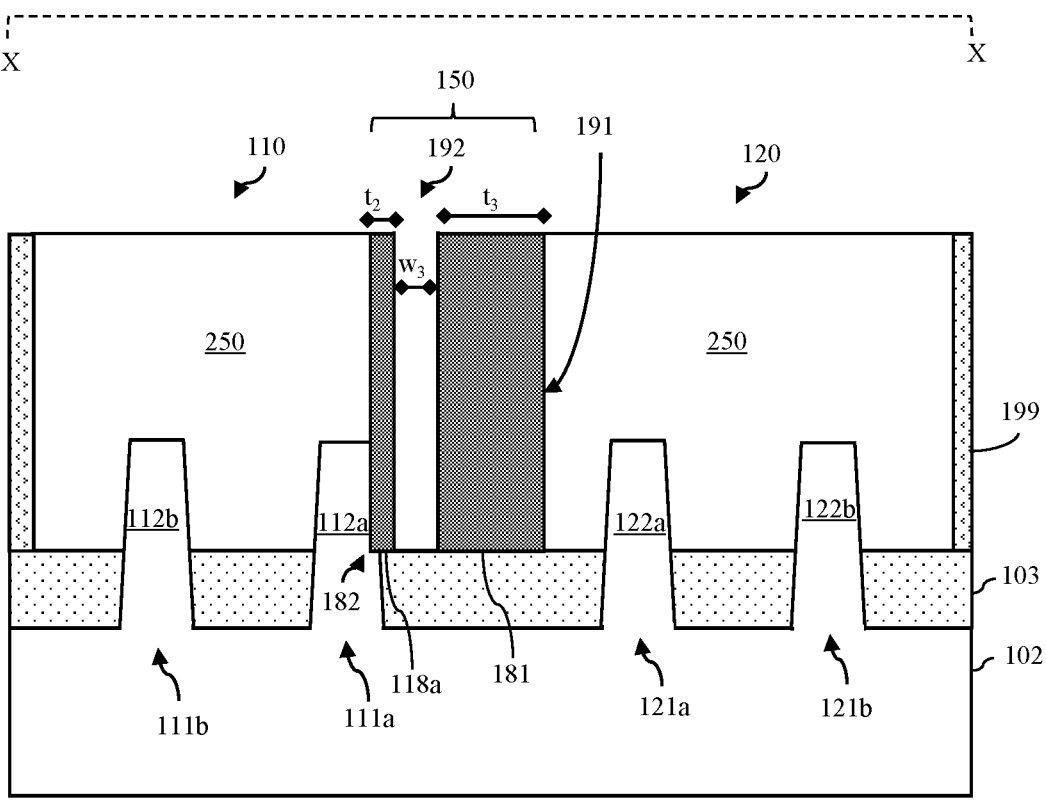

As discussed above with regard to the structure embodiments, in the final structure a supplementary gate structure 117.1 or 117.2 for the first FINFET 110 can be integrated into the isolation structure 150. To form the supplementary gate structure, an additional opening 192 can be formed in the isolation structure 150 (see process 208 and FIGS. 6A-6B). For example, another mask layer can be formed over the partially completed structure and patterned so that a mask opening with a desired width traverses the isolation structure. A selective anisotropic etch process can then be performed to form an additional opening 192, which is parallel to the first semiconductor fin, which traverses the isolation structure 150 the full distance (D) between sidewall spacers 199 and which further extends vertically to the top surface of the isolation region 103. Thus, the additional opening 192 can divide the isolation structure 150 into discrete portions including: a portion 118a between the opening and the remaining portion of the sacrificial gate structure 250 adjacent to the first semiconductor fins 111a-111b and another portion between the opening and the remaining portion of the sacrificial gate structure 250 adjacent to the second semiconductor fins 121a-121b. Possible dimensions of the additional opening 192 and adjacent portions of the isolation structure are discussed in greater detail above with regard to the structure embodiments.

Figure 7A:
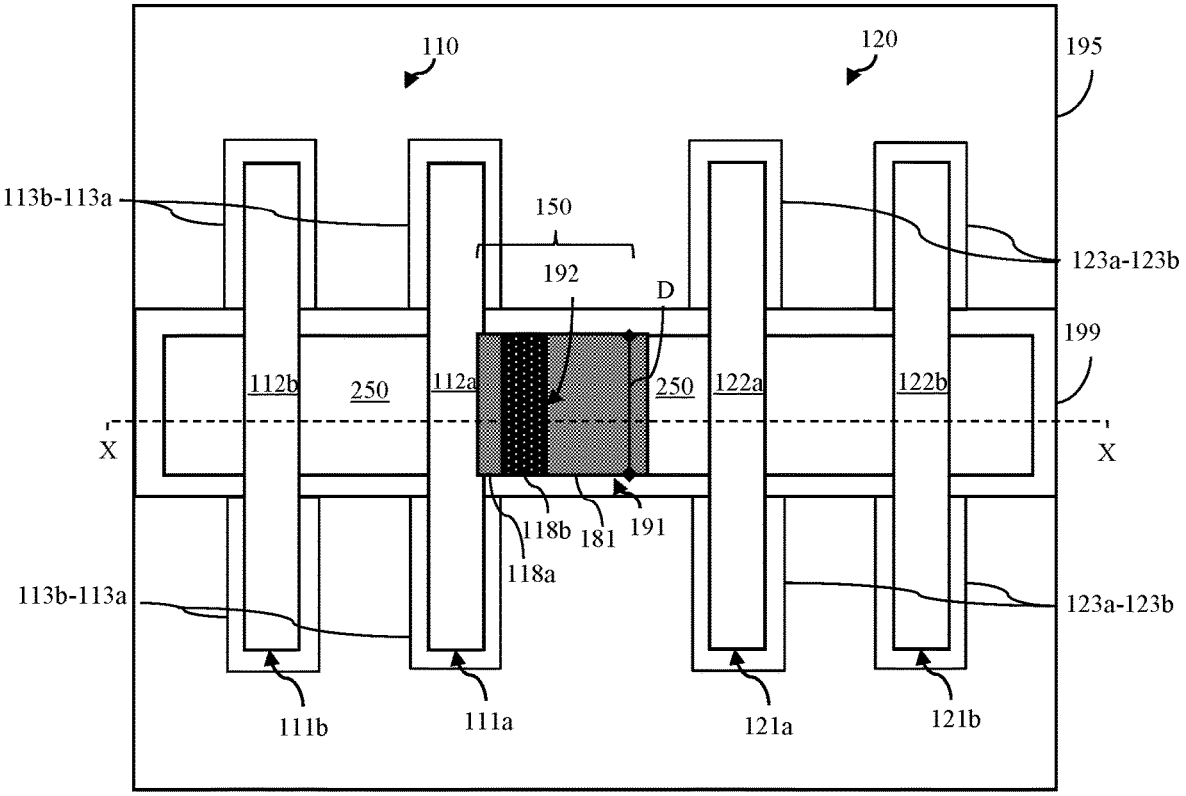
FIG. 7A is a layout diagram and FIG. 7B is a cross-section diagram of a partially completed semiconductor structure formed according to Process Flow 1 of the flow diagram of FIG. 2.
Figure 7B:
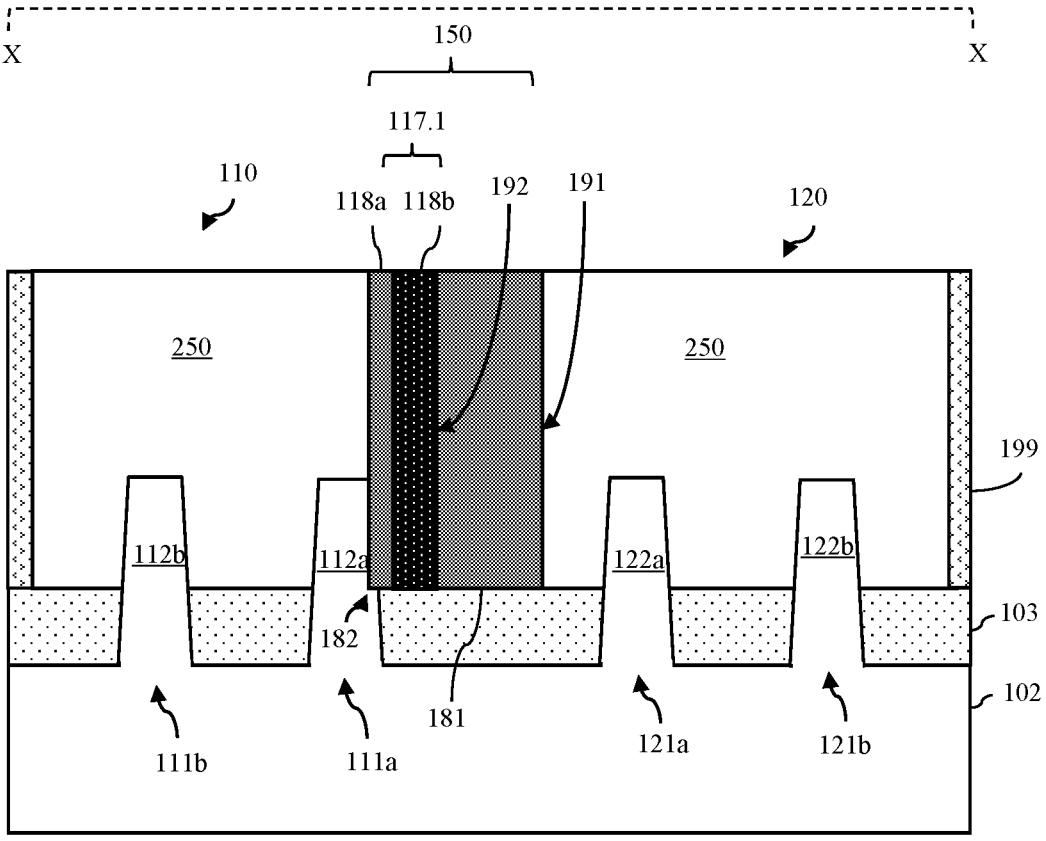

Referring to Process Flow 1 of the flow diagram of FIG. 2, to form the supplementary gate structure 117.1, a conductor layer 118b can be formed so as to fill the additional opening 192 (see process 210 and FIGS. 7A-7B). The conductor layer 118b can be formed, for example, using conventional MOL contact formation techniques. Materials for the conductor layer 118b can include, but are not limited to, tungsten, cobalt, or any other suitable MOL contact or other conductive material (e.g., doped polysilicon). A CMP process can be performed to remove any conductor material from above the sacrificial gate structure 250. Then, the remaining sections of the sacrificial gate structure 250 can be selectively removed, creating gate openings. Conventional RMG processing techniques can subsequently be performed in order to form RMGs for the first gate structure 115 and the second gate structure 125 in the gate openings (see process 212 and FIGS. 1A-1C). Conventional MOL and BEOL processing can subsequently be performed in order to complete the semiconductor structure 100.1 of FIGS. 1A-1C (see process 214, not shown). Such MOL and BEOL processing can include, but is not limited to, formation of one or more layers of ILD material over the FINFETs, formation of contacts extending through the ILD material to FINFET components, formation of BEOL interconnects, etc. These features and techniques for forming them are well known in the art. Thus, the details thereof have been omitted from this specification in order to allow the reader to focus on the salient aspects of the disclosed embodiments.

Figure 8A:
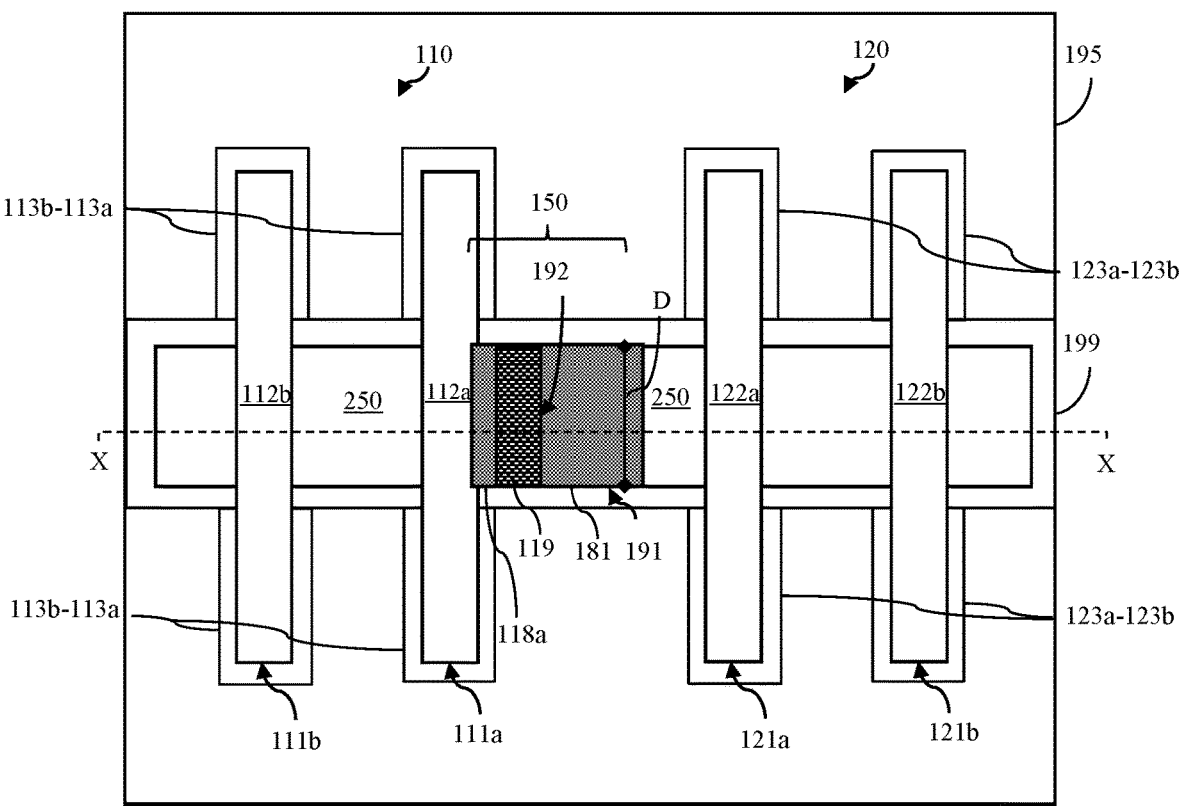
FIG. 8A is a layout diagram and FIG. 8B is a cross-section diagram of a partially completed semiconductor structure formed according to Process Flow 2 of the flow diagram of FIG. 2.
Figure 8B:
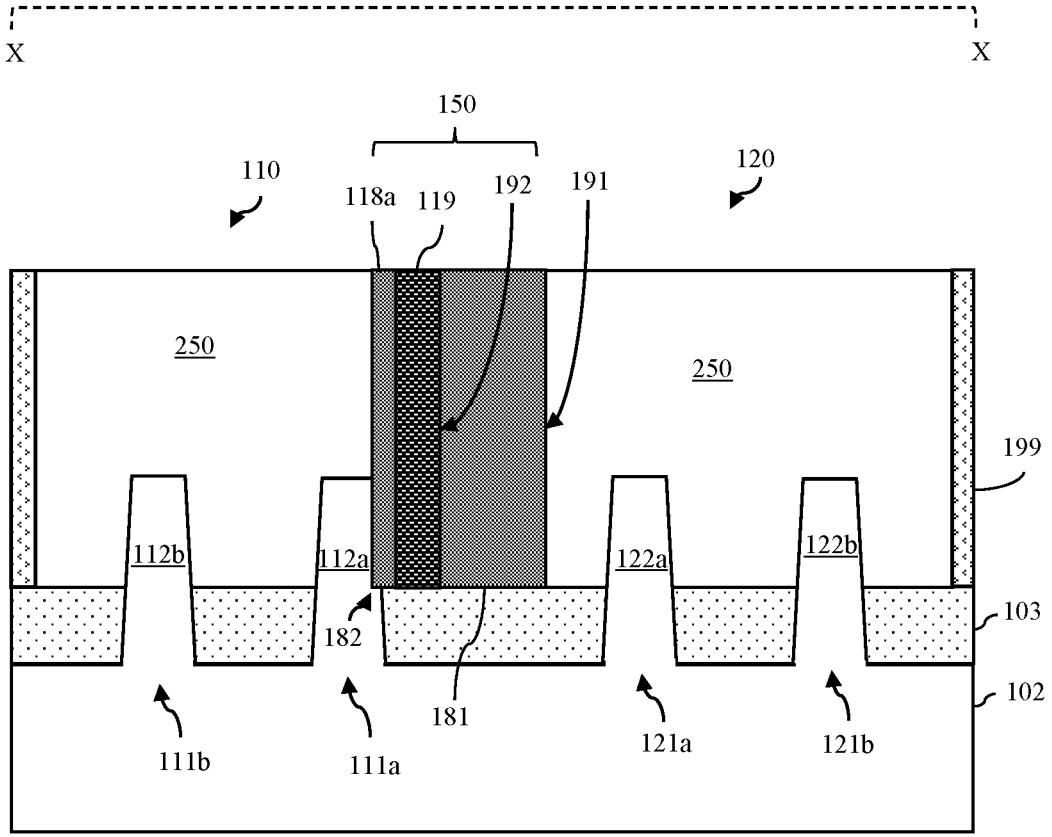
Figure 9:
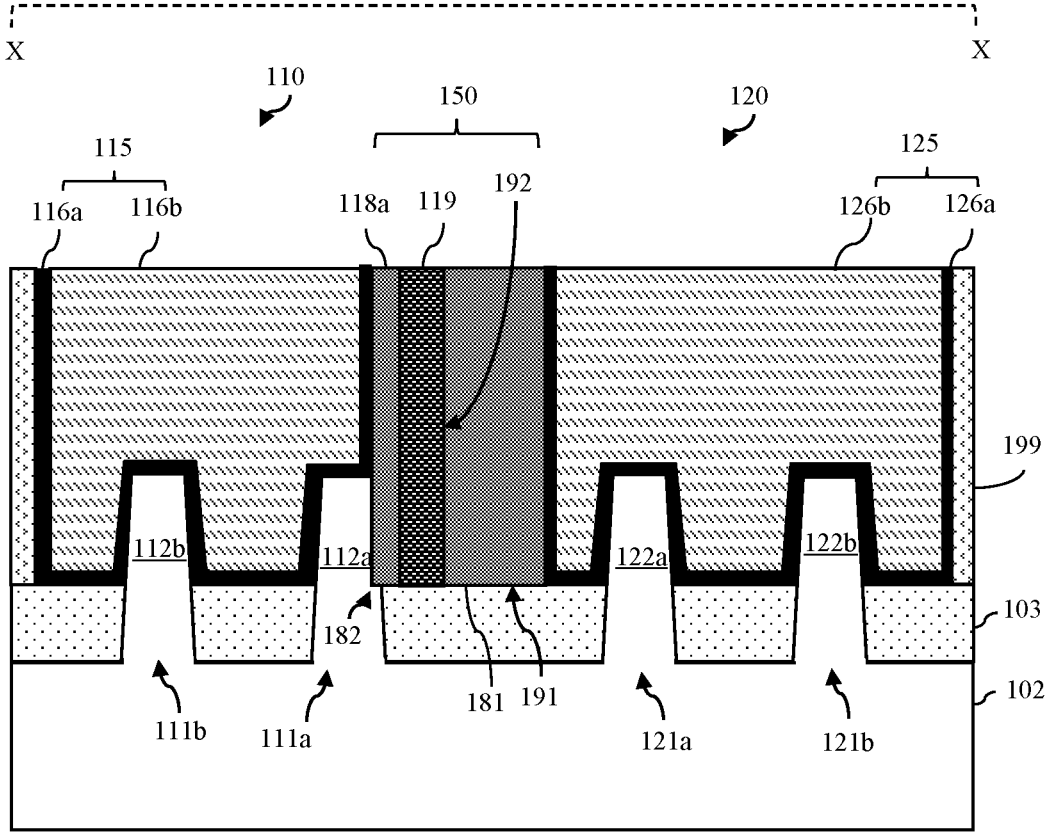
FIGS. 9-11 are cross-section diagrams illustrating partially completed semiconductor structures formed according to Process Flow 2 of the flow diagram of FIG. 2.
Figure 10:
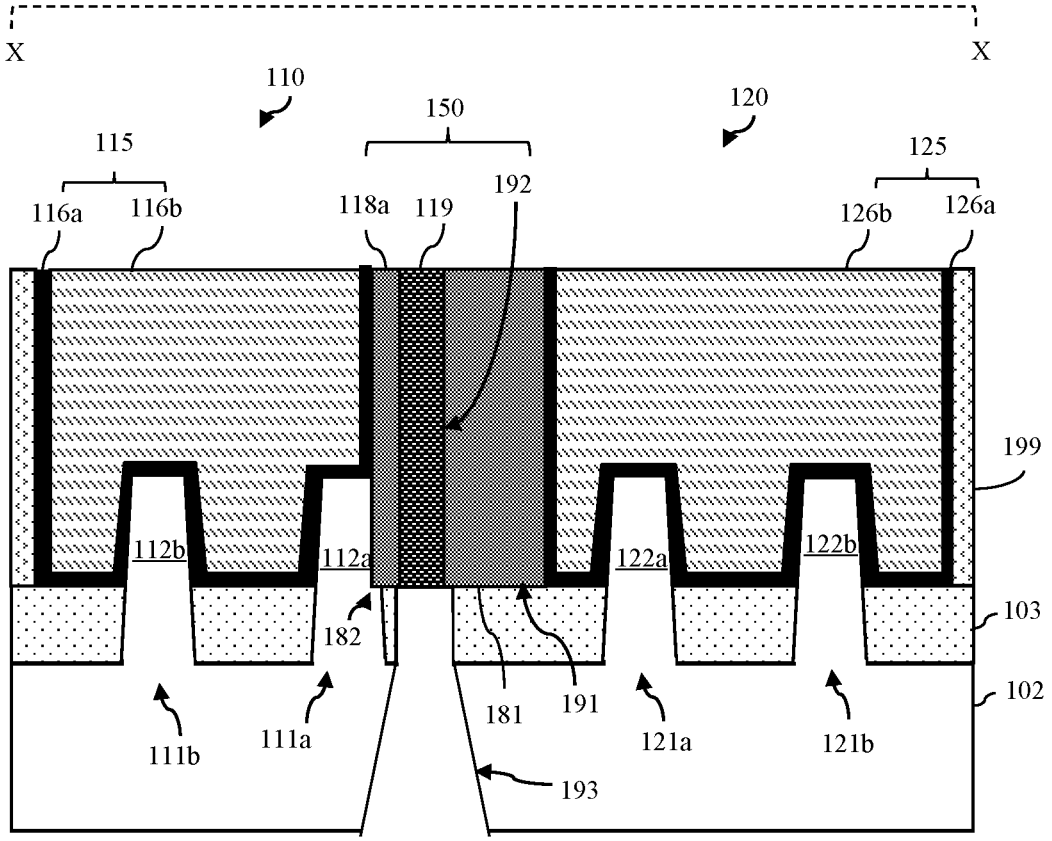
Figure 11:
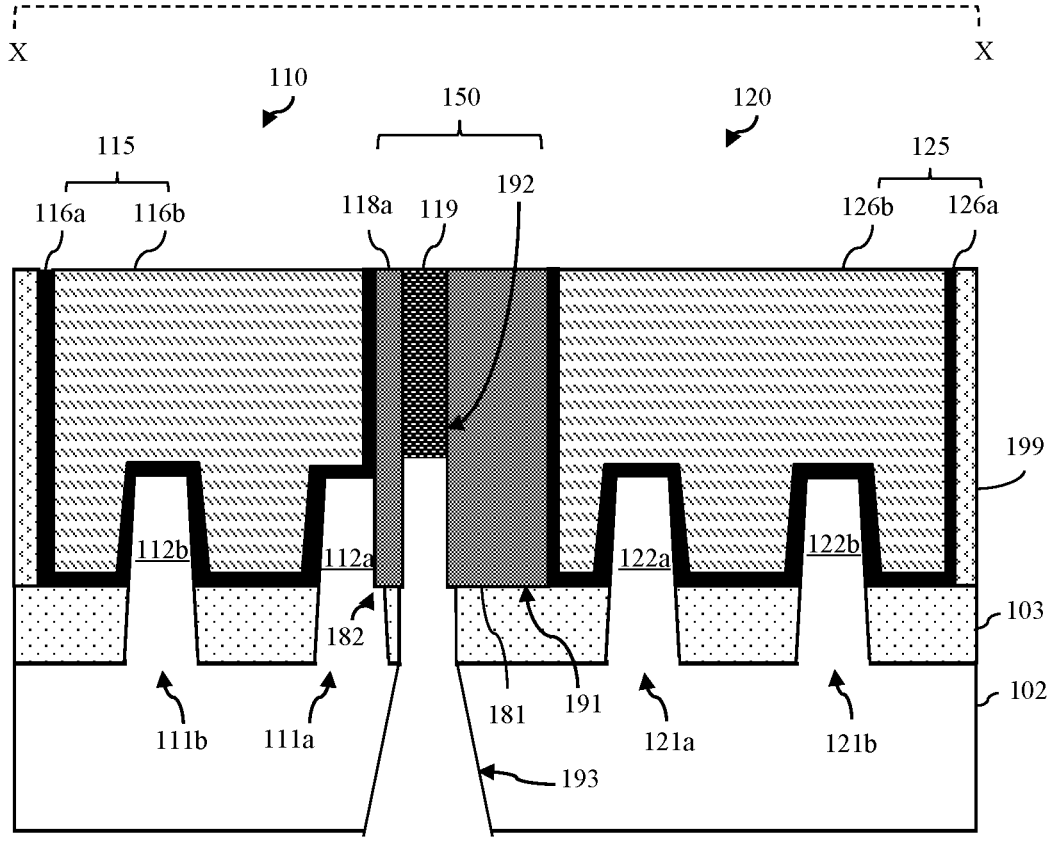

Referring to Process Flow 2 of the flow diagram of FIG. 2, to form the supplementary gate structure 117.2, a dielectric cap layer 119 (e.g., a SiN cap layer) can be formed so as to fill the additional opening 192 (see process 220 and FIGS. 8A-8B). A CMP process can be performed to remove any of the dielectric cap material from above the sacrificial gate structure 250. Then, the remaining sections of the sacrificial gate structure 250 can be selectively removed, creating gate openings. Conventional RMG processing techniques can subsequently be performed in order to form RMGs for the first gate structure 115 and the second gate structure 125 in the gate openings (see process 222 and FIG. 9). Conventional MOL and BEOL processing can subsequently be performed (see process 224, not shown; see also discussion of process 214 above). Next, a via 193 (also referred to herein as a through-substrate via (TSV)) can be formed (e.g., lithographically patterned and etched) such that it extends through the semiconductor substrate 102 and the isolation region 103 to the dielectric cap layer 119 at the bottom of the additional opening 192 (see process 226 and FIG. 10). A selective etch process can be performed to remove the dielectric cap layer 119 from a lower section of the additional opening 192 (see process 227 and FIG. 11). Then, the lower section of the additional opening 192 and the via 193 can be filled with the conductor layer 118b, for example, using conventional TSV fill techniques (see process 228 and FIGS. 1.2A-1.2C).

The process steps described above for forming the semiconductor structures 100.1 of FIGS. 1.1A-1.1C and 100.2 of FIGS. 1.2A-1.2C are provided for illustration purposes and are not intended to be limiting. For example, it should be understood that the order of process steps may be varied (e.g., the isolation structure 150 could, alternatively, be performed post RMG formation).

In the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

In the structures and methods described above an RMG can include, for example: a high-K gate dielectric layer; a work function metal layer on the high-K gate dielectric layer; an optional doped polysilicon gate conductor layer on the work function metal layer; and an optional metal silicide layer on the doped polysilicon gate conductor layer. Various different RMG structures are known in the art and, thus, the details thereof have been omitted from this specification in order to allow the reader to focus on the salient aspects of the disclosed embodiments. However, those skilled in the art will recognize that the configuration of the gate stack for an RMG can vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Exemplary metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Exemplary metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such gate structures and the techniques for forming them are well known in the art and, thus, the details thereof have been omitted from this specification in order to allow the reader to focus on the salient aspects of the disclosed embodiments.

The method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, in the structure and method embodiments described above, the terminology used is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first semiconductor fin on a semiconductor substrate and having a top surface and opposing sidewalls;
an isolation region on the semiconductor substrate positioned laterally adjacent to the opposing sidewalls;
an isolation structure and a first gate structure on the isolation region and positioned laterally adjacent to the opposing sidewalls, respectively, wherein the first gate structure further extends over the top surface of the first semiconductor fin and abuts the isolation structure; and
a supplementary gate structure integrated into the isolation structure and including: a conductor layer within an opening extending into the isolation structure; and a portion of the isolation structure positioned laterally between the first semiconductor fin and the conductor layer,
wherein the first semiconductor fin includes a channel region, and
wherein the first gate structure and the supplementary gate structure are adjacent to the opposing sidewalls of the first semiconductor fin at the channel region.

2. The structure of claim 1, further comprising source/drain regions,
wherein the channel region in the first semiconductor fin is positioned laterally between source/drain regions,
wherein the opening is parallel to the first semiconductor fin and divides the isolation structure into discrete portions,
wherein the structure further comprises sidewall spacers adjacent to sides of the first gate structure, the discrete portions of the isolation structure, and the conductor layer within the opening, and
wherein the sidewall spacers isolate the first gate structure and the supplementary gate structure from the source/drain regions.

3. The structure of claim 1, wherein the portion of the isolation structure between the conductor layer and the first semiconductor fin is less than 15 nm.

4. The structure of claim 1, wherein a bottom of the conductor layer is above the isolation region.

5. The structure of claim 1, further comprising at least one additional first semiconductor fin extending from the semiconductor substrate and parallel to the first semiconductor fin, wherein the first gate structure is further adjacent to the at least one additional first semiconductor fin.

6. The structure of claim 1, further comprising: a second semiconductor fin on the semiconductor substrate parallel to the first semiconductor fin; and a second gate structure adjacent to the second semiconductor fin, wherein the isolation structure is positioned laterally between the first gate structure and the second gate structure.

7. The structure of claim 6, wherein the conductor layer is closer to the first semiconductor fin than the second semiconductor fin.

8. A structure comprising:
   a first semiconductor fin on a semiconductor substrate and having a top surface and opposing sidewalls;
   an isolation region on the semiconductor substrate positioned laterally adjacent to the opposing sidewalls;
   an isolation structure and a first gate structure on the isolation region and positioned laterally adjacent to the opposing sidewalls, respectively, wherein the first gate structure further extends over the top surface of the first semiconductor fin and abuts the isolation structure;
   a supplementary gate structure integrated into the isolation structure and including: a conductor layer within an opening extending into the isolation structure; and a portion of the isolation structure positioned laterally between the first semiconductor fin and the conductor layer, wherein the conductor layer further fills a via that extends through the substrate and the isolation region to the opening; and
   a dielectric cap within the opening on the conductor layer.

9. The structure of claim 8, further comprising a channel region in the first semiconductor fin positioned laterally between source/drain regions,
   wherein the first gate structure and the supplementary gate structure are adjacent to the opposing sidewalls of the first semiconductor fin at the channel region,
   wherein the opening is parallel to the first semiconductor fin and divides the isolation structure into discrete portions,
   wherein the structure further comprises sidewall spacers adjacent to sides of the first gate structure, the discrete portions of the isolation structure, and the conductor layer within the opening, and
   wherein the sidewall spacers isolate the first gate structure and the supplementary gate structure from the source/drain regions.

10. The structure of claim 8, wherein the portion of the isolation structure between the conductor layer and the first semiconductor fin is less than 15 nm.

11. The structure of claim 8, wherein the via is wider than the opening.

12. The structure of claim 8, further comprising at least one additional first semiconductor fin extending from the semiconductor substrate and parallel to the first semiconductor fin, wherein the first gate structure is further adjacent to the at least one additional first semiconductor fin.

13. The structure of claim 8, further comprising: a second semiconductor fin extending from the semiconductor substrate and parallel to the first semiconductor fins; and a second gate structure adjacent to the second semiconductor fin, wherein the isolation structure is positioned laterally between the first gate structure and the second gate structure.

14. The structure of claim 13, wherein the conductor layer is closer to the first semiconductor fin than the second semiconductor fin.

15. A method comprising:
   forming a first semiconductor fin on a semiconductor substrate and having a top surface and opposing sidewalls;
   forming an isolation region on the semiconductor substrate positioned laterally adjacent to the opposing sidewalls;
   forming, on the isolation region, an isolation structure and a first gate structure positioned laterally adjacent to the opposing sidewalls, respectively, wherein the first gate structure extends over the top surface of the first semiconductor fin and abuts the isolation structure; and
   forming a supplementary gate structure integrated into the isolation structure, wherein the supplementary gate structure includes: a conductor layer within an opening extending through the isolation structure; and a portion of the isolation structure positioned laterally between the first semiconductor fin and the conductor layer,
   wherein the first semiconductor fin includes a channel region, and
   wherein the first gate structure and the supplementary gate structure are adjacent to the opposing sidewalls of the first semiconductor fin at the channel region.

16. The method of claim 15, wherein the forming of the isolation structure and the first gate structure includes:
   forming a gate structure on the isolation region adjacent to the top surface and the opposing sidewalls of the first semiconductor fin;
   forming sidewall spacers on the gate structure;
   forming a cut in the gate structure, wherein the cut is parallel to the first semiconductor fin extends vertically to the isolation region, extends laterally between the sidewall spacers, and exposes a sidewall of the first semiconductor fin;
   filling the cut with isolation material to form the isolation structure; and
   forming the opening in the isolation structure, wherein the opening divides the isolation structure into discrete portions.

17. The method of claim 16, further including filling the opening with the conductor layer.

18. The method of claim 16, further including:
   filling the opening with a dielectric cap layer;
   forming a via extending through the semiconductor substrate and the isolation region to the dielectric cap layer;
   removing the dielectric cap layer from a lower section of the opening; and
   filling the lower section of the opening and the via with the conductor layer.

19. The method of claim 16, wherein the opening is formed so the portion of the isolation structure between the conductor layer and the first semiconductor fin is less than 15 nm.

20. The method of claim 16, wherein the gate structure is formed adjacent to the channel region of the first semiconductor fin, wherein the method further comprises forming source/drain regions on the first semiconductor fin with the channel region positioned laterally between the source/drain regions and with the source/drain regions isolated from the gate structure by the sidewall spacers.

* * * * *